(12) United States Patent
Busby et al.

(10) Patent No.: US 10,169,968 B1
(45) Date of Patent: *Jan. 1, 2019

(54) MULTI-LAYER STACK WITH EMBEDDED TAMPER-DETECT PROTECTION

(71) Applicant: INTERNATIONAL BUSINESS MACHINES CORPORATION, Armonk, NY (US)

(72) Inventors: James A. Busby, New Paltz, NY (US); Phillip Duane Isaacs, Rochester, MN (US); William Santiago-Fernandez, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/048,634

(22) Filed: Jul. 30, 2018

Related U.S. Application Data

(63) Continuation of application No. 15/791,642, filed on Oct. 24, 2017, which is a continuation of application
(Continued)

(51) Int. Cl.
  *G08B 13/12* (2006.01)
(52) U.S. Cl.
  CPC .......... *G08B 13/12* (2013.01); *G08B 13/128* (2013.01)
(58) Field of Classification Search
  CPC combination set(s) only.
  See application file for complete search history.

(56) References Cited

U.S. PATENT DOCUMENTS

| 3,165,569 A | 1/1965 | Bright et al. |
| 4,097,894 A | 6/1978 | Tanner et al. |
| (Continued) | | |

FOREIGN PATENT DOCUMENTS

| CN | 2014-30639 Y | 3/2010 |
| CN | 10-4346587 A | 2/2015 |
| (Continued) | | |

OTHER PUBLICATIONS

Holm, Ragnar, "Electric Contacts: Theory and Application", Spinger-Verlag, New York, 4th Edition, 1981 (pp. 10-19).
(Continued)

*Primary Examiner* — Travis R Hunnings
(74) *Attorney, Agent, or Firm* — Tihon Poltavets, Esq.; Kevin P. Radigan, Esq.; Heslin Rothenberg Farley & Mesiti P.C.

(57) ABSTRACT

Tamper-respondent assemblies and methods of fabrication are provided which include a multi-layer stack having multiple discrete component layers stacked and electrically connected together via a plurality of electrical contacts in between the component layers. Further, the tamper-respondent assembly includes a tamper-respondent electronic circuit structure embedded within the multi-layer stack. The tamper-respondent electronic circuit structure includes at least one tamper-respondent sensor embedded, at least in part, within at least one component layer of the multiple discrete component layers of the multi-layer stack. The tamper-respondent electronic circuit structure defines a secure volume within the multi-layer stack. For instance, the tamper-respondent electronic circuit structure may be fully embedded within the multi-layer stack, with monitor circuitry of the tamper-respondent electronic circuit structure residing within the secure volume within the multi-layer stack.

11 Claims, 22 Drawing Sheets

Related U.S. Application Data

No. 15/053,336, filed on Feb. 25, 2016, now Pat. No. 9,916,744.

(56) References Cited

U.S. PATENT DOCUMENTS

| | | | |
|---|---|---|---|
| 4,160,503 A | 7/1979 | Ohlbach | |
| 4,211,324 A | 7/1980 | Ohlbach | |
| 4,324,823 A | 4/1982 | Ray, III | |
| 4,450,504 A | 5/1984 | Severson | |
| 4,516,679 A | 5/1985 | Simpson | |
| 4,496,900 A | 6/1985 | Di Stefano et al. | |
| 4,542,337 A | 9/1985 | Rausch | |
| 4,593,384 A | 6/1986 | Kleijne | |
| 4,609,104 A | 9/1986 | Kasper et al. | |
| 4,653,252 A | 3/1987 | Van de Haar et al. | |
| 4,677,809 A | 7/1987 | Long et al. | |
| 4,691,350 A | 9/1987 | Kleijne et al. | |
| 4,807,284 A | 2/1989 | Kleijne | |
| 4,811,288 A | 3/1989 | Kleijne et al. | |
| 4,847,139 A | 7/1989 | Wolf et al. | |
| 4,860,351 A | 8/1989 | Weingart | |
| 4,865,197 A | 9/1989 | Craig | |
| 5,009,311 A | 4/1991 | Schenk | |
| 5,027,397 A | 6/1991 | Double et al. | |
| 5,060,114 A | 10/1991 | Feinberg et al. | |
| 5,075,822 A | 12/1991 | Baumler et al. | |
| 5,117,457 A | 5/1992 | Comerford et al. | |
| 5,159,629 A | 10/1992 | Double et al. | |
| 5,185,717 A | 2/1993 | Mori | |
| 5,201,868 A | 4/1993 | Johnson | |
| 5,201,879 A | 4/1993 | Steele et al. | |
| 5,211,618 A | 5/1993 | Stoltz | |
| 5,239,664 A | 8/1993 | Verrier et al. | |
| 5,243,162 A | 9/1993 | Kobayashi | |
| 5,389,738 A | 2/1995 | Piosenka et al. | |
| 5,406,630 A | 4/1995 | Piosenka et al. | |
| 5,458,912 A | 10/1995 | Camilletti et al. | |
| 5,506,566 A | 4/1996 | Oldfield et al. | |
| 5,568,124 A | 10/1996 | Joyce et al. | |
| 5,594,439 A | 1/1997 | Swanson | |
| 5,675,319 A | 10/1997 | Rivenberg et al. | |
| 5,715,652 A | 2/1998 | Stahlecker | |
| 5,761,054 A | 6/1998 | Kuhn | |
| 5,813,113 A | 9/1998 | Stewart et al. | |
| 5,858,500 A | 1/1999 | MacPherson | |
| 5,880,523 A | 3/1999 | Candelore | |
| 5,975,420 A | 11/1999 | Gogami et al. | |
| 5,988,510 A | 11/1999 | Tuttle et al. | |
| 6,121,544 A | 9/2000 | Petsinger | |
| 6,195,267 B1 | 2/2001 | MacDonald, Jr. et al. | |
| 6,201,296 B1 | 3/2001 | Fries et al. | |
| 6,233,339 B1 | 5/2001 | Kawano et al. | |
| 6,259,363 B1 | 7/2001 | Payne | |
| 6,261,215 B1 | 7/2001 | Imer | |
| 6,301,096 B1 | 10/2001 | Wozniczka | |
| 6,355,316 B1 | 3/2002 | Miller et al. | |
| 6,384,397 B1 | 5/2002 | Takiar et al. | |
| 6,396,400 B1 | 5/2002 | Epstein, III et al. | |
| 6,420,971 B1 | 7/2002 | Leck et al. | |
| 6,424,954 B1 | 7/2002 | Leon | |
| 6,438,825 B1 | 8/2002 | Kuhn | |
| 6,469,625 B1 | 10/2002 | Tomooka | |
| 6,473,995 B2 | 11/2002 | Miyakawa et al. | |
| 6,512,454 B2 | 1/2003 | Miglioli et al. | |
| 6,686,539 B2 | 2/2004 | Farquhar et al. | |
| 6,746,960 B2 | 6/2004 | Goodman et al. | |
| 6,798,660 B2 | 9/2004 | Moss et al. | |
| 6,817,204 B2 | 11/2004 | Bash et al. | |
| 6,853,093 B2 | 2/2005 | Cohen et al. | |
| 6,879,032 B2 | 4/2005 | Rosenau et al. | |
| 6,895,509 B1 | 5/2005 | Clark | |
| 6,929,900 B2 | 8/2005 | Farquhar et al. | |
| 6,946,960 B2 | 9/2005 | Sisson et al. | |
| 6,957,345 B2 | 10/2005 | Cesana et al. | |
| 6,970,360 B2 | 11/2005 | Sinha | |
| 6,982,642 B1 | 1/2006 | Cesana et al. | |
| 6,985,362 B2 | 1/2006 | Mori et al. | |
| 6,991,961 B2 | 1/2006 | Hubbard et al. | |
| 6,996,953 B2 | 2/2006 | Perreault et al. | |
| 7,005,733 B2 | 2/2006 | Kommerling et al. | |
| 7,007,171 B1 | 2/2006 | Butturini et al. | |
| 7,015,823 B1 | 3/2006 | Gillen et al. | |
| 7,054,162 B2 * | 5/2006 | Benson | G06F 21/86 257/678 |
| 7,057,896 B2 | 6/2006 | Matsuo et al. | |
| 7,094,143 B2 | 8/2006 | Wolm et al. | |
| 7,094,459 B2 | 8/2006 | Takahashi | |
| 7,095,615 B2 | 8/2006 | Nichols | |
| 7,156,233 B2 | 1/2007 | Clark et al. | |
| 7,180,008 B2 * | 2/2007 | Heitmann | G06F 21/87 174/261 |
| 7,189,360 B1 | 3/2007 | Ho et al. | |
| 7,214,874 B2 | 5/2007 | Dangler et al. | |
| 7,247,791 B2 | 7/2007 | Kulpa | |
| 7,304,373 B2 | 12/2007 | Taggart et al. | |
| 7,310,737 B2 | 12/2007 | Patel et al. | |
| 7,465,887 B2 | 12/2008 | Suzuki et al. | |
| 7,475,474 B2 | 1/2009 | Heitmann et al. | |
| 7,515,418 B2 | 4/2009 | Straznicky et al. | |
| 7,549,064 B2 | 6/2009 | Elbert et al. | |
| 7,640,658 B1 | 1/2010 | Pham et al. | |
| 7,643,290 B1 | 1/2010 | Narasimhan et al. | |
| 7,663,883 B2 | 2/2010 | Shirakami et al. | |
| 7,671,324 B2 | 3/2010 | Fleischman et al. | |
| 7,672,129 B1 | 3/2010 | Ouyang et al. | |
| 7,731,517 B2 | 6/2010 | Lee et al. | |
| 7,746,657 B2 | 6/2010 | Oprea et al. | |
| 7,760,086 B2 | 7/2010 | Hunter et al. | |
| 7,768,005 B2 | 8/2010 | Condorelli et al. | |
| 7,783,994 B2 | 8/2010 | Ball et al. | |
| 7,787,256 B2 | 8/2010 | Chan et al. | |
| 7,868,411 B2 | 1/2011 | Eaton et al. | |
| 7,898,413 B2 | 3/2011 | Hsu et al. | |
| 7,901,977 B1 | 3/2011 | Angelopoulos et al. | |
| 7,947,911 B1 | 5/2011 | Pham et al. | |
| 7,978,070 B2 | 7/2011 | Hunter | |
| 8,006,101 B2 | 8/2011 | Crawford | |
| 8,084,855 B2 | 12/2011 | Lower et al. | |
| 8,094,450 B2 | 1/2012 | Cole et al. | |
| 8,101,267 B2 | 1/2012 | Samuels et al. | |
| 8,133,621 B2 | 3/2012 | Wormald et al. | |
| 8,199,506 B2 | 6/2012 | Janik et al. | |
| 8,287,336 B2 | 10/2012 | Dangler et al. | |
| 8,325,486 B2 | 12/2012 | Arshad et al. | |
| 8,345,423 B2 | 1/2013 | Campbell et al. | |
| 8,393,918 B2 | 3/2013 | Cheng et al. | |
| 8,516,269 B1 | 8/2013 | Hamlet et al. | |
| 8,589,703 B2 | 11/2013 | Lee et al. | |
| 8,646,108 B2 | 2/2014 | Shiakallis et al. | |
| 8,659,506 B2 | 2/2014 | Nomizo | |
| 8,659,908 B2 | 2/2014 | Adams et al. | |
| 8,664,047 B2 | 3/2014 | Lower et al. | |
| 8,716,606 B2 | 5/2014 | Kelley et al. | |
| 8,797,059 B2 | 8/2014 | Boday et al. | |
| 8,836,509 B2 | 9/2014 | Lowy | |
| 8,853,839 B2 | 10/2014 | Gao et al. | |
| 8,879,266 B2 | 11/2014 | Jarvis et al. | |
| 8,890,298 B2 | 11/2014 | Buer et al. | |
| 8,947,889 B2 | 2/2015 | Kelley et al. | |
| 8,961,280 B2 | 2/2015 | Dangler et al. | |
| 9,003,199 B2 | 4/2015 | Dellmo et al. | |
| 9,011,762 B2 | 4/2015 | Seppa et al. | |
| 9,052,070 B2 | 6/2015 | Davis et al. | |
| 9,166,586 B2 | 10/2015 | Carapelli et al. | |
| 9,298,956 B2 | 3/2016 | Wade et al. | |
| 9,554,477 B1 * | 1/2017 | Brodsky | H05K 5/0208 |
| 9,555,606 B1 | 1/2017 | Fisher et al. | |
| 9,560,737 B2 * | 1/2017 | Isaacs | H05K 1/0203 |
| 9,578,735 B2 | 2/2017 | Fisher et al. | |
| 9,578,764 B1 * | 2/2017 | Fisher | H05K 5/0208 |
| 9,586,857 B2 | 3/2017 | Cabral, Jr. et al. | |
| 9,591,776 B1 * | 3/2017 | Brodsky | H05K 5/0247 |
| 9,661,747 B1 | 5/2017 | Brodsky et al. | |
| 9,681,649 B2 | 6/2017 | Busby et al. | |

(56) References Cited

U.S. PATENT DOCUMENTS

| | | |
|---|---|---|
| 9,717,154 B2 | 7/2017 | Brodsky et al. |
| 9,858,776 B1 | 1/2018 | Busby et al. |
| 9,877,383 B2 | 1/2018 | Brodsky et al. |
| 9,881,880 B2 | 1/2018 | Busby et al. |
| 9,894,749 B2 | 2/2018 | Brodsky et al. |
| 9,904,811 B2 | 2/2018 | Campbell et al. |
| 9,911,012 B2 | 3/2018 | Brodsky et al. |
| 9,913,362 B2 | 3/2018 | Brodsky et al. |
| 9,913,370 B2 | 3/2018 | Busby et al. |
| 9,913,416 B2 | 3/2018 | Fisher et al. |
| 9,916,744 B2 * | 3/2018 | Busby .................. G08B 13/128 |
| 9,924,591 B2 | 3/2018 | Brodsky et al. |
| 9,930,768 B2 | 3/2018 | Fisher et al. |
| 9,936,573 B2 | 4/2018 | Brodsky et al. |
| 9,949,357 B2 | 4/2018 | Fisher et al. |
| 9,978,231 B2 | 5/2018 | Isaacs |
| 9,999,124 B2 | 6/2018 | Busby et al. |
| 2001/0049021 A1 | 12/2001 | Valimont |
| 2001/0050425 A1 | 12/2001 | Beroz et al. |
| 2001/0056542 A1 | 12/2001 | Cesana et al. |
| 2002/0002683 A1 * | 1/2002 | Benson .................. G06F 21/86 713/194 |
| 2002/0068384 A1 | 6/2002 | Beroz et al. |
| 2002/0084090 A1 | 7/2002 | Farquhar |
| 2003/0009683 A1 | 1/2003 | Schwenck et al. |
| 2003/0009684 A1 | 1/2003 | Schwenck et al. |
| 2003/0198022 A1 | 10/2003 | Ye et al. |
| 2004/0218366 A1 | 11/2004 | Speigl |
| 2005/0068735 A1 | 3/2005 | Fissore et al. |
| 2005/0111194 A1 | 5/2005 | Sohn et al. |
| 2005/0161253 A1 | 7/2005 | Heitmann et al. |
| 2005/0180104 A1 | 8/2005 | Olesen et al. |
| 2006/0034731 A1 | 2/2006 | Lewis et al. |
| 2006/0049941 A1 | 3/2006 | Hunter et al. |
| 2006/0072288 A1 | 4/2006 | Stewart et al. |
| 2006/0080348 A1 | 4/2006 | Cesana et al. |
| 2006/0196945 A1 | 9/2006 | Mendels |
| 2006/0218779 A1 | 10/2006 | Ooba et al. |
| 2007/0038865 A1 | 2/2007 | Oggioni et al. |
| 2007/0064396 A1 | 3/2007 | Oman et al. |
| 2007/0064399 A1 | 3/2007 | Mandel et al. |
| 2007/0108619 A1 | 5/2007 | Hsu |
| 2007/0125867 A1 | 6/2007 | Oberle |
| 2007/0211436 A1 | 9/2007 | Robinson et al. |
| 2007/0223165 A1 | 9/2007 | Itri et al. |
| 2007/0230127 A1 | 10/2007 | Peugh et al. |
| 2007/0268671 A1 | 11/2007 | Brandenburg et al. |
| 2007/0271544 A1 | 11/2007 | Engstrom |
| 2008/0036598 A1 | 2/2008 | Oggioni |
| 2008/0050512 A1 | 2/2008 | Lower et al. |
| 2008/0061972 A1 | 3/2008 | Hwang et al. |
| 2008/0086876 A1 | 4/2008 | Douglas |
| 2008/0128897 A1 | 6/2008 | Chao |
| 2008/0144290 A1 | 6/2008 | Brandt et al. |
| 2008/0159539 A1 | 7/2008 | Huang et al. |
| 2008/0160274 A1 | 7/2008 | Dang et al. |
| 2008/0191174 A1 | 8/2008 | Ehrensvard et al. |
| 2008/0251906 A1 | 10/2008 | Eaton et al. |
| 2008/0278353 A1 | 11/2008 | Smith et al. |
| 2009/0031135 A1 | 1/2009 | Kothandaraman |
| 2009/0040735 A1 * | 2/2009 | Chan ........................ G06F 21/87 361/748 |
| 2009/0073659 A1 | 3/2009 | Peng et al. |
| 2009/0152339 A1 | 6/2009 | Hawkins et al. |
| 2009/0166065 A1 | 7/2009 | Clayton et al. |
| 2009/0212945 A1 | 8/2009 | Steen |
| 2010/0088528 A1 | 4/2010 | Sion |
| 2010/0110647 A1 | 5/2010 | Hiew et al. |
| 2010/0134959 A1 | 6/2010 | Fife et al. |
| 2010/0177487 A1 * | 7/2010 | Arshad .................. G06F 21/86 361/737 |
| 2010/0319986 A1 | 12/2010 | Bleau et al. |
| 2011/0001237 A1 | 1/2011 | Brun et al. |
| 2011/0038123 A1 | 2/2011 | Janik et al. |
| 2011/0103027 A1 | 5/2011 | Aoki et al. |
| 2011/0241446 A1 | 10/2011 | Tucholski |
| 2011/0299244 A1 | 12/2011 | Dede et al. |
| 2012/0047374 A1 | 2/2012 | Klum et al. |
| 2012/0050998 A1 | 3/2012 | Klum et al. |
| 2012/0052252 A1 | 3/2012 | Kohli et al. |
| 2012/0068846 A1 | 3/2012 | Dalzell et al. |
| 2012/0117666 A1 | 5/2012 | Oggioni et al. |
| 2012/0140421 A1 | 6/2012 | Kirstine et al. |
| 2012/0319986 A1 | 6/2012 | Toh et al. |
| 2012/0170217 A1 | 7/2012 | Nishikimi et al. |
| 2012/0185636 A1 | 7/2012 | Leon et al. |
| 2012/0244742 A1 | 9/2012 | Wertz et al. |
| 2012/0256305 A1 | 10/2012 | Kaufmann et al. |
| 2012/0320529 A1 | 12/2012 | Loong et al. |
| 2013/0021758 A1 | 1/2013 | Bernstein et al. |
| 2013/0033818 A1 | 2/2013 | Hosoda et al. |
| 2013/0058052 A1 * | 3/2013 | Arshad .................. G06F 21/86 361/737 |
| 2013/0104252 A1 | 4/2013 | Yanamadala et al. |
| 2013/0141137 A1 | 6/2013 | Krutzik et al. |
| 2013/0154834 A1 | 6/2013 | Busca et al. |
| 2013/0158936 A1 | 6/2013 | Rich et al. |
| 2013/0208422 A1 | 8/2013 | Hughes et al. |
| 2013/0235527 A1 | 9/2013 | Wagner et al. |
| 2013/0283386 A1 * | 10/2013 | Lee .......................... G06F 21/86 726/26 |
| 2014/0022733 A1 | 1/2014 | Lim et al. |
| 2014/0027159 A1 | 1/2014 | Salle et al. |
| 2014/0028335 A1 | 1/2014 | Salle et al. |
| 2014/0033331 A1 | 1/2014 | Salle et al. |
| 2014/0160679 A1 | 6/2014 | Kelty et al. |
| 2014/0184263 A1 | 7/2014 | Ehrenpfordt et al. |
| 2014/0204533 A1 | 7/2014 | Abeyasekera et al. |
| 2014/0206800 A1 | 7/2014 | Wu et al. |
| 2014/0233165 A1 | 8/2014 | Farkas et al. |
| 2014/0296410 A1 | 10/2014 | Cheng et al. |
| 2014/0306014 A1 | 10/2014 | Salle et al. |
| 2014/0321064 A1 | 10/2014 | Bose et al. |
| 2014/0325688 A1 | 10/2014 | Cashin et al. |
| 2015/0007427 A1 | 1/2015 | Dangler et al. |
| 2015/0120072 A1 | 4/2015 | Marom et al. |
| 2015/0143551 A1 | 5/2015 | Tiemeijer |
| 2015/0163933 A1 * | 6/2015 | Steiner ................ H05K 5/0208 174/50.51 |
| 2015/0213243 A1 * | 7/2015 | Hughes .................. G06F 21/31 726/30 |
| 2015/0235053 A1 | 8/2015 | Lee et al. |
| 2015/0244374 A1 | 8/2015 | Hadley |
| 2015/0307250 A1 | 10/2015 | Sokol |
| 2016/0005262 A1 | 1/2016 | Hirato et al. |
| 2016/0012693 A1 | 1/2016 | Sugar |
| 2016/0262253 A1 * | 9/2016 | Isaacs .................. H05K 1/0203 |
| 2016/0262270 A1 | 9/2016 | Isaacs et al. |
| 2017/0006712 A1 | 1/2017 | Matsushima et al. |
| 2017/0019987 A1 | 3/2017 | Dragone et al. |
| 2017/0068881 A1 | 3/2017 | Camper et al. |
| 2017/0089729 A1 * | 3/2017 | Brodsky .................. G01D 5/16 |
| 2017/0089977 A1 | 3/2017 | Warnock et al. |
| 2017/0091491 A1 * | 3/2017 | Dangler ................ H05K 3/10 |
| 2017/0091492 A1 * | 3/2017 | Brodsky .................. G06F 21/87 |
| 2017/0094778 A1 * | 3/2017 | Brodsky .............. H05K 1/0275 |
| 2017/0094783 A1 * | 3/2017 | Dangler ................ H05K 3/10 |
| 2017/0094803 A1 | 3/2017 | Dangler et al. |
| 2017/0094804 A1 | 3/2017 | Brodsky et al. |
| 2017/0094805 A1 | 3/2017 | Dangler et al. |
| 2017/0094808 A1 | 3/2017 | Brodsky et al. |
| 2017/0103683 A1 | 4/2017 | Yazdi et al. |
| 2017/0108543 A1 | 4/2017 | Brodsky et al. |
| 2017/0111998 A1 | 4/2017 | Brodsky et al. |
| 2017/0156223 A1 | 6/2017 | Fisher et al. |
| 2017/0171999 A1 | 6/2017 | Fisher et al. |
| 2017/0249813 A1 * | 8/2017 | Busby .................. G08B 13/128 |
| 2017/0286725 A1 | 10/2017 | Lewis |
| 2018/0061196 A1 | 3/2018 | Busby et al. |
| 2018/0070444 A1 | 3/2018 | Brodsky et al. |
| 2018/0082556 A1 | 3/2018 | Dragone et al. |
| 2018/0092203 A1 | 3/2018 | Dragone et al. |
| 2018/0092204 A1 | 3/2018 | Dragone et al. |
| 2018/0096173 A1 | 4/2018 | Brodsky et al. |

(56) References Cited

U.S. PATENT DOCUMENTS

| | | |
|---|---|---|
| 2018/0098423 A1 | 4/2018 | Brodsky et al. |
| 2018/0098424 A1 | 4/2018 | Busby et al. |
| 2018/0102329 A1 | 4/2018 | Busby et al. |
| 2018/0103537 A1 | 4/2018 | Brodsky et al. |
| 2018/0103538 A1 | 4/2018 | Brodsky et al. |
| 2018/0107848 A1 | 4/2018 | Campbell et al. |
| 2018/0108229 A1 | 4/2018 | Busby et al. |
| 2018/0110142 A1 | 4/2018 | Fisher et al. |
| 2018/0110165 A1 | 4/2018 | Fisher et al. |
| 2018/0235081 A1 | 8/2018 | Brodsky et al. |

FOREIGN PATENT DOCUMENTS

| | | |
|---|---|---|
| DE | 19816571 A1 | 10/1999 |
| DE | 19816572 A1 | 10/1999 |
| DE | 10-2012-203955 A1 | 9/2013 |
| EP | 0 056 360 A1 | 10/1993 |
| EP | 0 629 497 A2 | 12/1994 |
| EP | 1 734 578 A1 | 12/2006 |
| EP | 1 968 362 A2 | 9/2008 |
| EP | 2 104 407 A1 | 9/2009 |
| EP | 1 672 464 B1 | 4/2012 |
| EP | 2 560 467 A1 | 2/2013 |
| JP | 61-297035 A | 12/1986 |
| JP | 2000-238141 A | 9/2000 |
| JP | 2007-173416 A | 7/2007 |
| JP | 2007-305761 A | 11/2007 |
| JP | 2013-125807 A | 6/2013 |
| JP | 2013-140112 A | 7/2013 |
| WO | WO 1999/003675 A1 | 1/1999 |
| WO | WO 1999/021142 A1 | 4/1999 |
| WO | WO 2001/063994 A2 | 8/2001 |
| WO | WO 2003/012606 A2 | 2/2003 |
| WO | WO 2003/025080 A1 | 3/2003 |
| WO | WO 2004/040505 A1 | 5/2004 |
| WO | WO 2009/042335 A1 | 4/2009 |
| WO | WO 2009/092472 A1 | 7/2009 |
| WO | WO 2010/128939 A1 | 11/2010 |
| WO | WO 2013/004292 A1 | 1/2013 |
| WO | WO 2013/189483 A1 | 12/2013 |
| WO | WO 2014/086987 A2 | 6/2014 |
| WO | WO 2014/158159 A1 | 10/2014 |

OTHER PUBLICATIONS

Clark, Andrew J., "Physical Protection of Cryptographic Devices", Advanced in Cyprtology, Eurocrypt '87, Springer, Berlin Heidelberg (1987) (11 pages).

Halperin et al., "Latent Open Testing of Electronic Packaging", MCMC-194, IEEE (1994) (pp. 83-33).

Simek, Bob, "Tamper Restrictive Thermal Ventilation System for Enclosures Requiring Ventilation and Physical Security", IBM Publication No. IPCOM000008607D, Mar. 1, 1998 (2 pages).

NIST, "Security Requirements for Cryptographic Modules", FIPS Pub. 140-2, Issued May 25, 2001.

Pamula et al., "Cooling of Integrated Circuits Using Droplet-Based Microfluidics", Association for Computing Machinery (ACM), GLSVLSI'03, Apr. 28-29, 2003 (pp. 84-87).

Saran et al., "Fabrication and Characterization of Thin Films of Single-Walled Carbon Nanotube Bundles on Flexible Plastic Substrates", Journal of the American Chemical Society, vol. 126, No. 14 (Mar. 23, 2004) (pp. 4462-4463).

Khanna P.K. et al., "Studies on Three-Dimensional Moulding, Bonding and Assembling of Low-Temperature-Cofired Ceramics MEMS and MST Applications." Materials Chemistry and Physics, vol. 89, No. 1 (2005) (pp. 72-79).

Drimer et al., "Thinking Inside the Box: System-Level Failures of Tamper Proofing", 2008 IEEE Symposium on Security and Privacy, (Feb. 2008) (pp. 281-295).

Loher et al., "Highly Integrated Flexible Electronic Circuits and Modules", 3rd International IEEE on Microsystems, Packaging, Assembly & Circuits Technology Conference (Oct. 22-24, 2008) (Abstract Only) (1 page).

Sample et al., "Design of an RFID-Based Battery-Free Programmable Sensing Platform", IEEE Transactions on Instrumentation and Measurement, vol. 57, No. 11, Nov. 2008 (pp. 2608-2615).

Jhang et al., "Nonlinear Ultrasonic Techniques for Non-Destructive Material: A Review", International Journal of Prec. Eng. & Manuf., vol. 10, No. 1, Jan. 2009 (pp. 123-135).

Anonymous, "Consolidated Non-Volatile Memory in a Chip Stack", IBM Technical Disclosure: IP.com No. IPCOM000185250, Jul. 16, 2009 (6 pages).

Isaacs et al., "Tamper Proof, Tamper Evident Encryption Technology", Pan Pacific Symposium SMTA Proceedings (2013) (9 pages).

Anonymous, "Selective Memory Encryption", IBM Technical Disclosure: IP.com IPCOM000244183, Nov. 20, 2015 (6 pages).

Zhou et al., "Nonlinear Analysis for Hardware Trojan Detection", ICSPCC2015, IEEE (2015) (4 pages).

Harting Mitronics, "Saftey Caps for Payment Terminals", http://harting-mitronics.ch/fileadmin/hartingmitronics/case_studies/Saftey_caps_for_payment_terminals.pdf, downloaded Aug. 2016 (2 pages).

Gold Phoenix Printed Circuit Board, "Why multilayer pcb is used so widely?", May 7, 2012, accessed online @ [http://www.goldphoenixpcb.com/html/Support_Resource/others/arc_110.html] on Feb. 15, 2017.

Busby et al., "Enclosure-to-Board Interface with Tamper-Detect Circuit(s)", U.S. Appl. No. 15/901,985, filed Feb. 22, 2018 (59 pages).

Brodsky et al., "Tamper-Respondent Sensors with Liquid Crystal Polymer Layers", U.S. Appl. No. 15/944,898, filed Apr. 4, 2018 (59 pages).

Busby et al., "Tamper-Proof Electronic Packages with Stressed Glass Component Substrate(s)", U.S. Appl. No. 16/045,868, filed Jul. 26, 2018 (53 pages).

Busby et al., "Tamper-Proof Electronic Packages with Stressed Glass Component Substrate(s)", U.S. Appl. No. 16/045,880, filed Jul. 26, 2018 (55 pages).

Busby et al., "Multi-Layer Stack with Embedded Tamper-Detect Protection", U.S. Appl. No. 16/048,622, filed Jul. 30, 2018 (64 pages).

Busby et al., "Multi-Layer Stack with Embedded Tamper-Detect Protection", U.S. Appl. No. 16/048,650, filed Jul. 30, 2018 (68 pages).

Busby et al., "List of IBM Patents and Patent Applications Treated as Related", U.S. Appl. No. 16/048,634, filed Jul. 30, 2018, dated Sep. 19, 2018 (2 pages).

\* cited by examiner

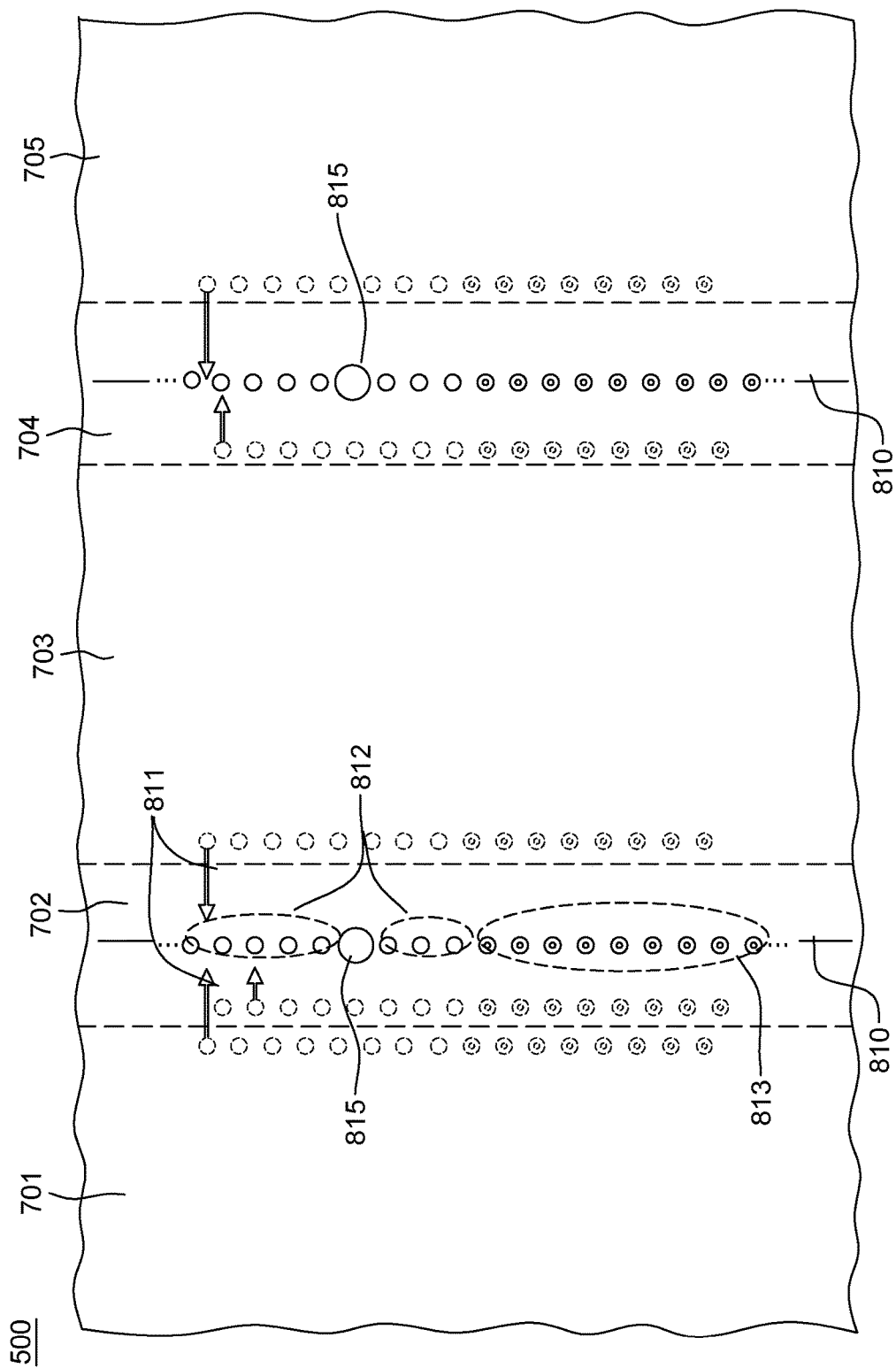

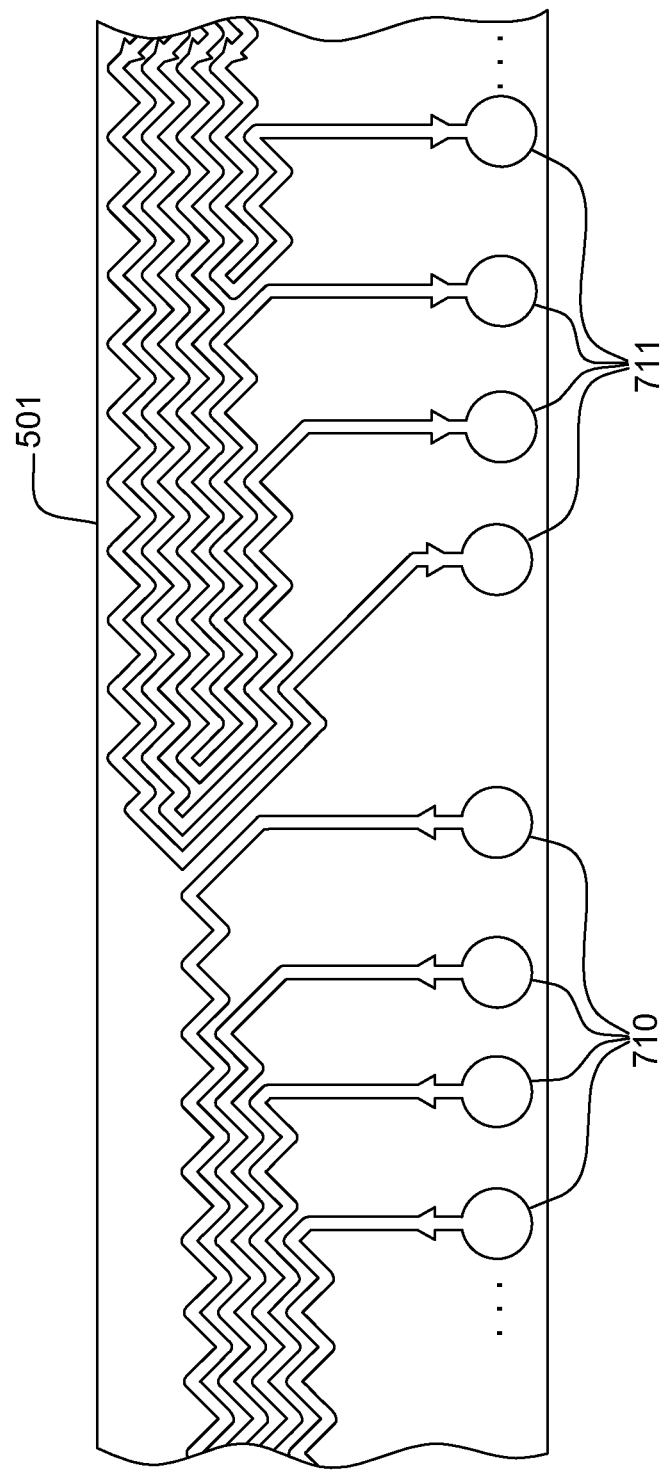

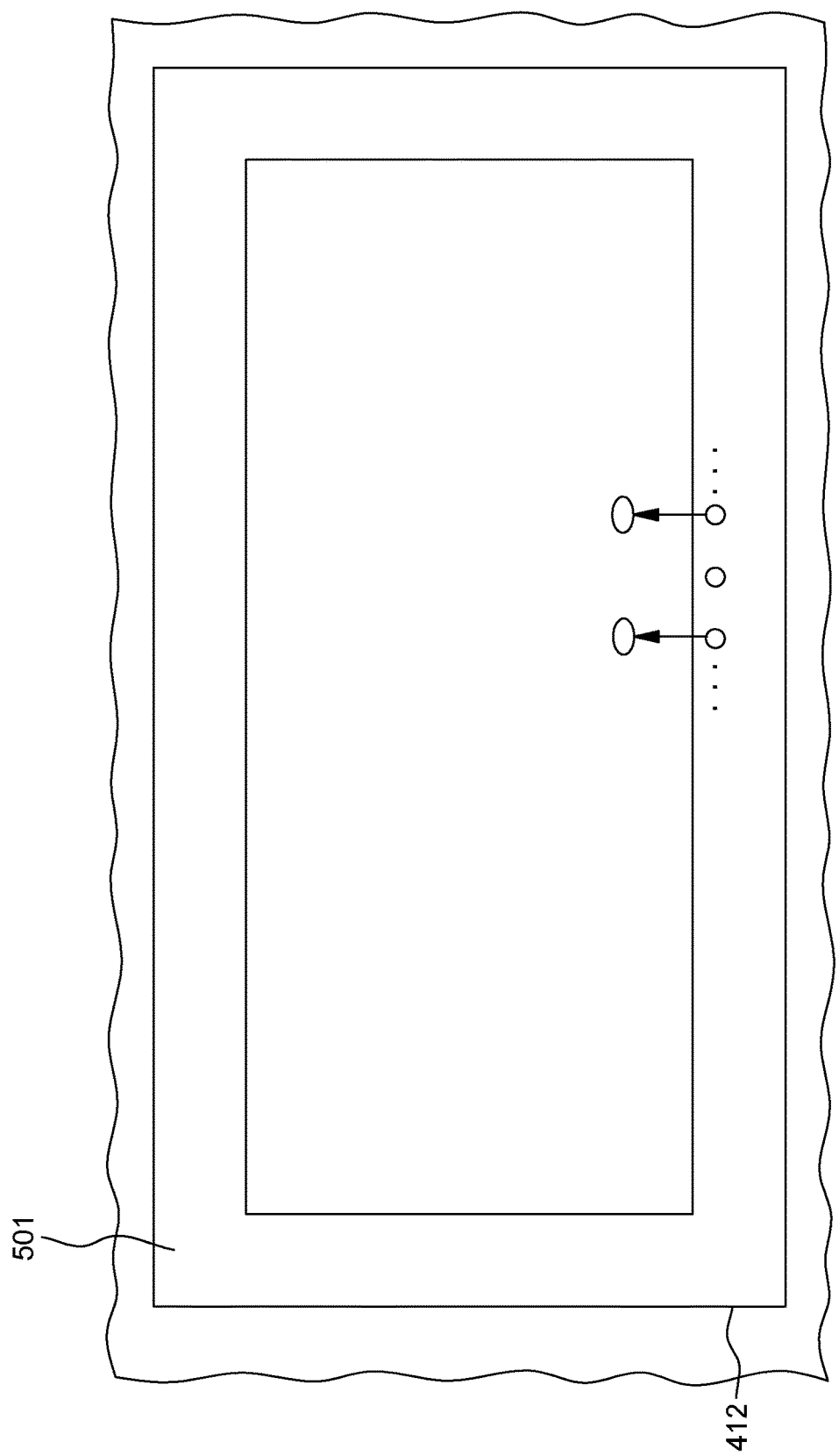

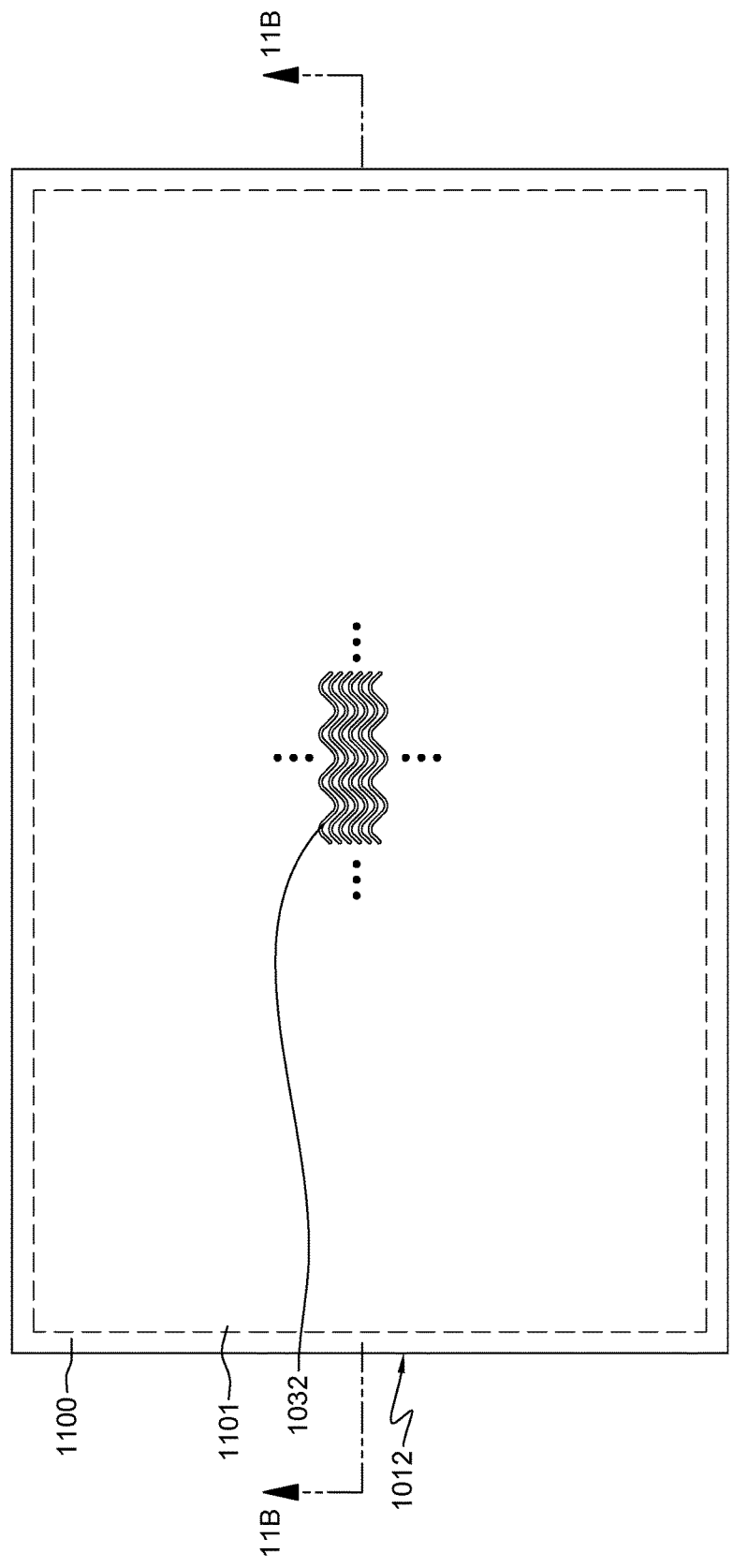
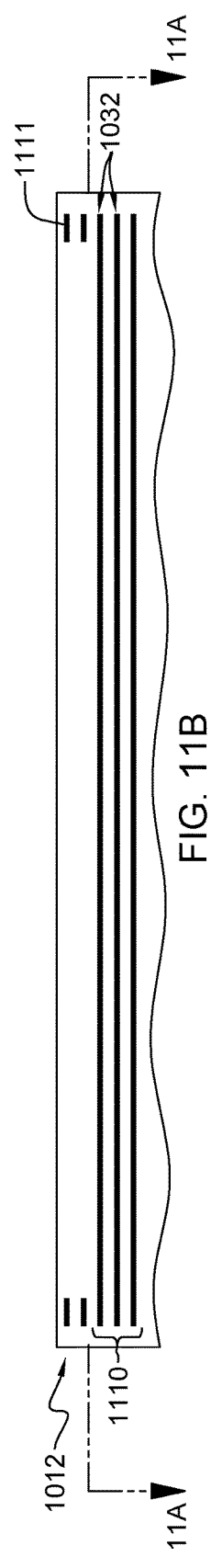

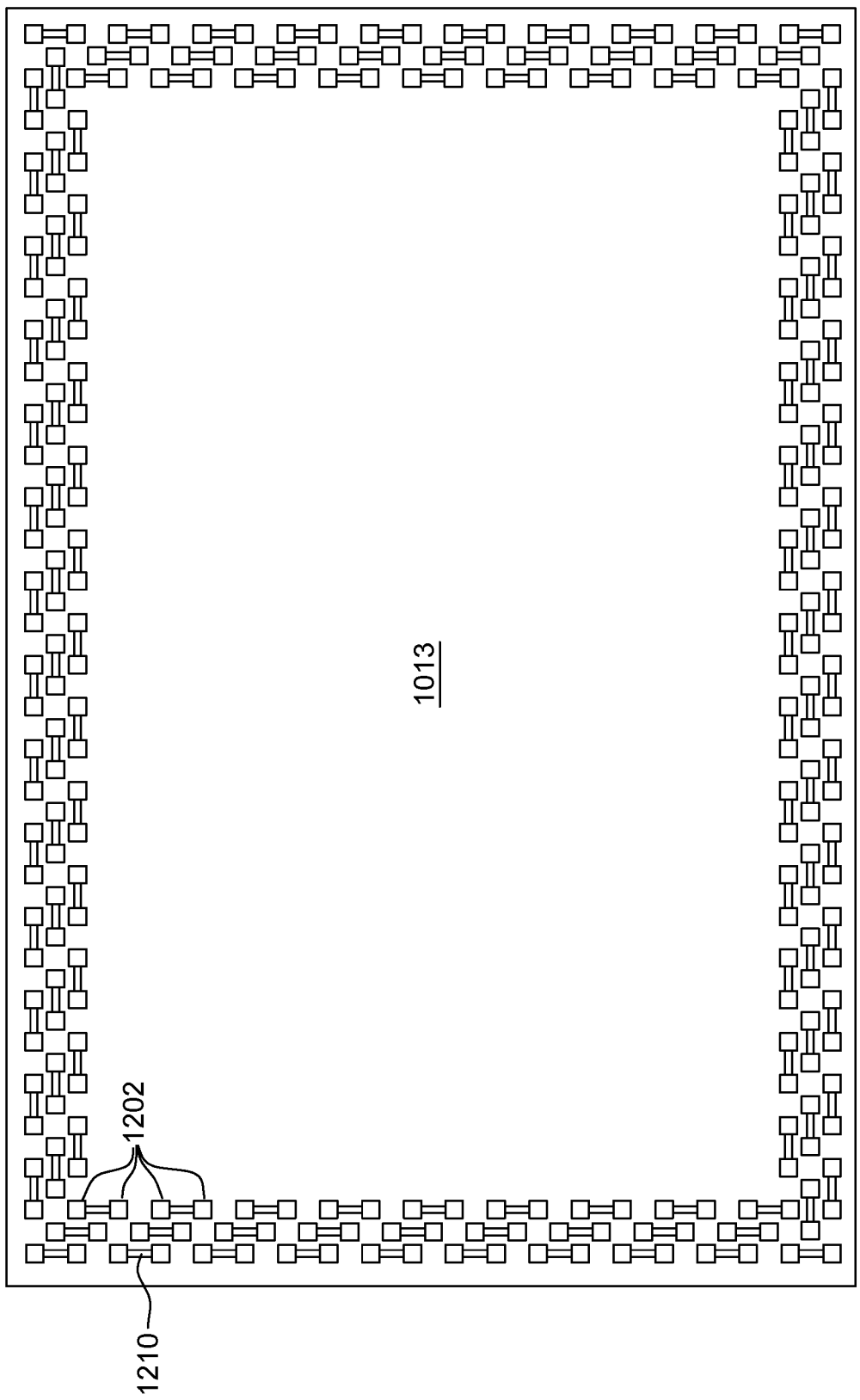

MULTI-LAYER STACK WITH EMBEDDED TAMPER-DETECT PROTECTION

BACKGROUND

Many activities require secure electronic communications. To facilitate secure electronic communications, an encryption/decryption system may be implemented on an electronic assembly or printed circuit board assembly that is included in equipment connected to a communications network. Such an electronic assembly is an enticing target for malefactors since it may contain codes or keys to decrypt intercepted messages, or to encode fraudulent messages. To prevent this, an electronic assembly may be mounted in an enclosure, which is then wrapped in a security sensor, and encapsulated with polyurethane resin. A security sensor may be, in one or more embodiments, a web or sheet of insulating material with circuit elements, such as closely-spaced, conductive lines fabricated on it. The circuit elements are disrupted if the sensor is torn, and the disruption can be sensed in order to generate an alarm signal. The alarm signal may be conveyed to a monitor circuit in order to reveal an attack on the integrity of the assembly. The alarm signal may also trigger an erasure of encryption/decryption keys stored within the electronic assembly.

In the above configuration, the electronic package, or tamper-proof electronic package, may be difficult to test due to the presence of the security sensor wrapped fully around the enclosure. Additionally, in this configuration it is difficult to recover components from the electronic package, for instance, should a manufacturing defect in the package be detected.

SUMMARY

Thus, provided herein, in one or more aspects, is a tamper-respondent assembly comprising a multi-layer stack including multiple discrete component layers stacked and electrically connected together via a plurality of electrical contacts in between the component layers; and a tamper-respondent electronic circuit structure embedded within the multi-layer stack, the tamper-respondent electronic circuit structure comprising at least one tamper-respondent sensor embedded, at least in part, within at least one component layer of the multiple discrete component layers of the multi-layer stack, the tamper-respondent electronic circuit structure defining a secure volume within the multi-layer stack. Further, the tamper-respondent electronic circuit structure is embedded within the multi-layer stack, and the secure volume resides fully within the multi-layer stack.

In a further aspect, a method of fabricating a tamper-respondent assembly is provided which includes: providing a multi-layer stack comprising multiple discrete component layers stacked and electrically connected together via a plurality of electrical contacts in between the component layers; and embedding a tamper-respondent electronic circuit structure within the multi-layer stack, the tamper-respondent electronic circuit structure comprising at least one tamper-respondent sensor embedded, at least in part, within at least one component layer of the multiple discrete component layers of the multi-layer stack, the tamper-respondent electronic circuit structure defining a secure volume within the multi-layer stack. Further, the tamper-respondent electronic circuit structure is embedded within the multi-layer stack, and the secure volume resides fully within the multi-layer stack.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 8C is a plan view of a wiring layer overlying the tamper-respondent mat layer of FIG. 8A, and illustrating an offsetting of the conductive vias from the tamper-respondent mat layer of FIG. 8A to selected locations within the wiring layer, which also accommodate (in the depicted example) external signal line vias facilitating communication to and from the secure volume associated with the multilayer circuit board, in accordance with one or more aspects of the present invention;

FIG. 8F is a partial depiction of conductive traces for a tamper-respondent frame such as illustrated in FIG. 8E, in accordance with one or more aspects of the present invention;

FIG. 8G is a plan view of a second tamper-respondent frame overlying the first tamper-respondent frame, and further facilitating defining the secure volume in association with the multilayer circuit board, in accordance with one or more aspects of the present invention;

FIG. 11A is a cross-sectional plan view of one embodiment of a sensor component layer of the multi-layer stack of FIG. 10, taken along line 11A-11A of FIG. 11B, and illustrating, in part, a mat-type, tamper-detect circuit within the sensor component layer, in accordance with one or more aspects of the present invention;

FIG. 11B is a cross-sectional elevational view of the sensor component layer of FIG. 11A, taken along line 11B-11B thereof, and depicting multiple mat-type, tamper-respondent circuits within the sensor component, as well as multiple frame-type, tamper-detect circuits, in accordance with one or more aspects of the present invention;

FIG. 12B is a cross-sectional plan view of the structure of FIG. 12A, taken along line 12B-12B thereof, and showing one embodiment of electrical interconnect at the sensor component layer of the sub-stack, depicting an electrical stitch pattern for connecting through-substrate vias within the in-between component layers of the sub-stack into the at least one peripheral tamper-detect circuit, in accordance with one or more aspects of the present invention.

DETAILED DESCRIPTION

Aspects of the present invention and certain features, advantages, and details thereof, are explained more fully below with reference to the non-limiting example(s) illustrated in the accompanying drawings. Descriptions of well-known materials, fabrication tools, processing techniques, etc., are omitted so as not to unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art for this disclosure. Note further that reference is made below to the drawings, which are not drawn to scale for ease of understanding, wherein the same reference numbers used throughout different figures designate the same or similar components. Also, note that numerous inventive aspects and features are disclosed herein, and unless otherwise inconsistent, each disclosed aspect or feature is combinable with any other disclosed aspect or feature as desired for a particular application, for establishing a secure volume for an electronic component or electronic circuit to be protected.

Figure 1:
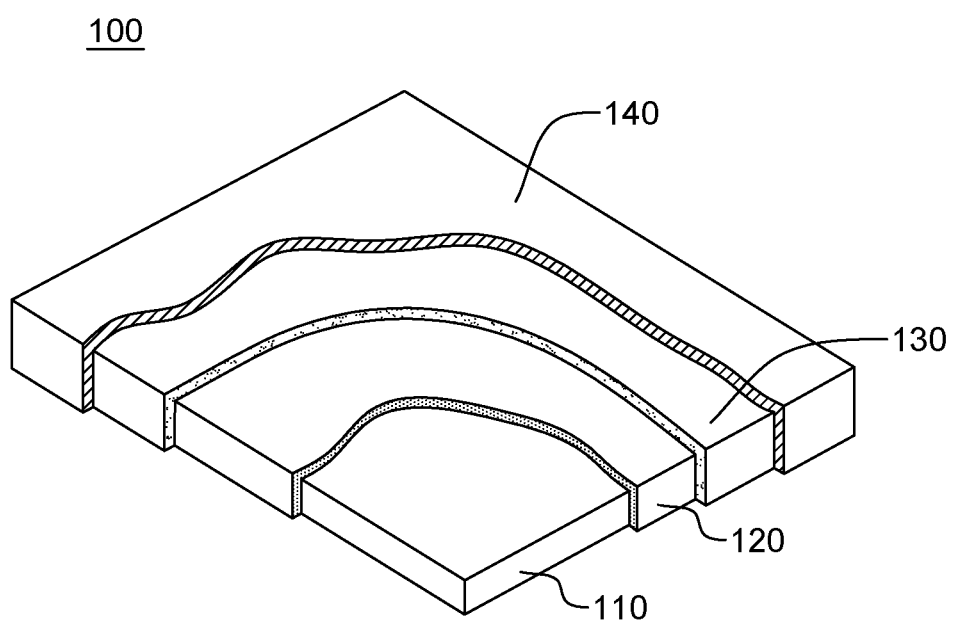
FIG. 1 is a partial cut-away of one embodiment of a tamper-proof electronic package.

Reference is first made to FIG. 1 of the drawings, which illustrates one embodiment of an electronic assembly package 100 configured as a tamper-proof electronic assembly package for purposes of discussion. In the depicted embodiment, an electronic assembly enclosure 110 is provided containing, for instance, an electronic assembly, which in one embodiment may include a plurality of electronic components, such as an encryption and/or decryption module and associated memory. The encryption and/or decryption module may comprise security-sensitive information with, for instance, access to the information stored in the module requiring use of a variable key, and with the nature of the key being stored in the associated memory within the enclosure.

In one or more implementations, a tamper-proof electronic package such as depicted is configured or arranged to detect attempts to tamper-with or penetrate into electronic assembly enclosure 110. Accordingly, electronic assembly enclosure 110 also includes, for instance, a monitor circuit which, if tampering is detected, activates an erase circuit to erase information stored within the associated memory, as well as the encryption and/or decryption module within the communications card. These components may be mounted on, and interconnected by, a multi-layer circuit board, such as a printed circuit board or other multi-layer substrate, and be internally or externally powered via a power supply provided within the electronic assembly enclosure.

In the embodiment illustrated, and as one example only, electronic assembly enclosure 110 may be surrounded by a tamper-respondent sensor 120, an encapsulant 130, and an outer, thermally conductive enclosure 140. In one or more implementations, tamper-respondent sensor 120 may include a tamper-respondent laminate that is folded around electronic assembly enclosure 110, and encapsulant 130 may be provided in the form of a molding. Tamper-respondent sensor 120 may include various detection layers, which are monitored through, for instance, a ribbon cable by the enclosure monitor, against sudden violent attempts to penetrate enclosure 110 and damage the enclosure monitor or erase circuit, before information can be erased from the encryption module. The tamper-respondent sensor may be, for example, any such article commercially available or described in various publications and issued patents, or any enhanced article such as disclosed herein.

By way of example, tamper-respondent sensor 120 may be formed as a tamper-respondent laminate comprising a number of separate layers with, for instance, an outermost lamination-respondent layer including a matrix of, for example, diagonally-extending or sinusoidally-extending, conductive or semi-conductive lines printed onto a regular, thin insulating film. The matrix of lines forms a number of continuous conductors which would be broken if attempts are made to penetrate the film. The lines may be formed, for instance, by printing carbon-loaded Polymer Thick Film (PTF) ink onto the film and selectively connecting the lines on each side, by conductive vias, near the edges of the film. Connections between the lines and an enclosure monitor of the communications card may be provided via, for instance, one or more ribbon cables. The ribbon cable itself may be formed of lines of conductive ink printed onto an extension of the film, if desired. Connections between the matrix and the ribbon cable may be made via connectors formed on one edge of the film. As noted, the laminate may be wrapped around the electronic assembly enclosure to define the tamper-respondent sensor 120 surrounding enclosure 110.

In one or more implementations, the various elements of the laminate may be adhered together and wrapped around enclosure 110, in a similar manner to gift-wrapping a parcel, to define the tamper-respondent sensor shape 120. The assembly may be placed in a mold which is then filled with, for instance, cold-pour polyurethane, and the polyurethane may be cured and hardened to form an encapsulant 130. The encapsulant may, in one or more embodiments, completely surround the tamper-respondent sensor 120 and enclosure 110, and thus form a complete environmental seal, protecting the interior of the enclosure. The hardened polyurethane is resilient and increases robustness of the electronic package in normal use. Outer, thermally conductive enclosure 140 may optionally be provided over encapsulant 130 to, for instance, provide further structural rigidity to the electronic package.

Figure 2:
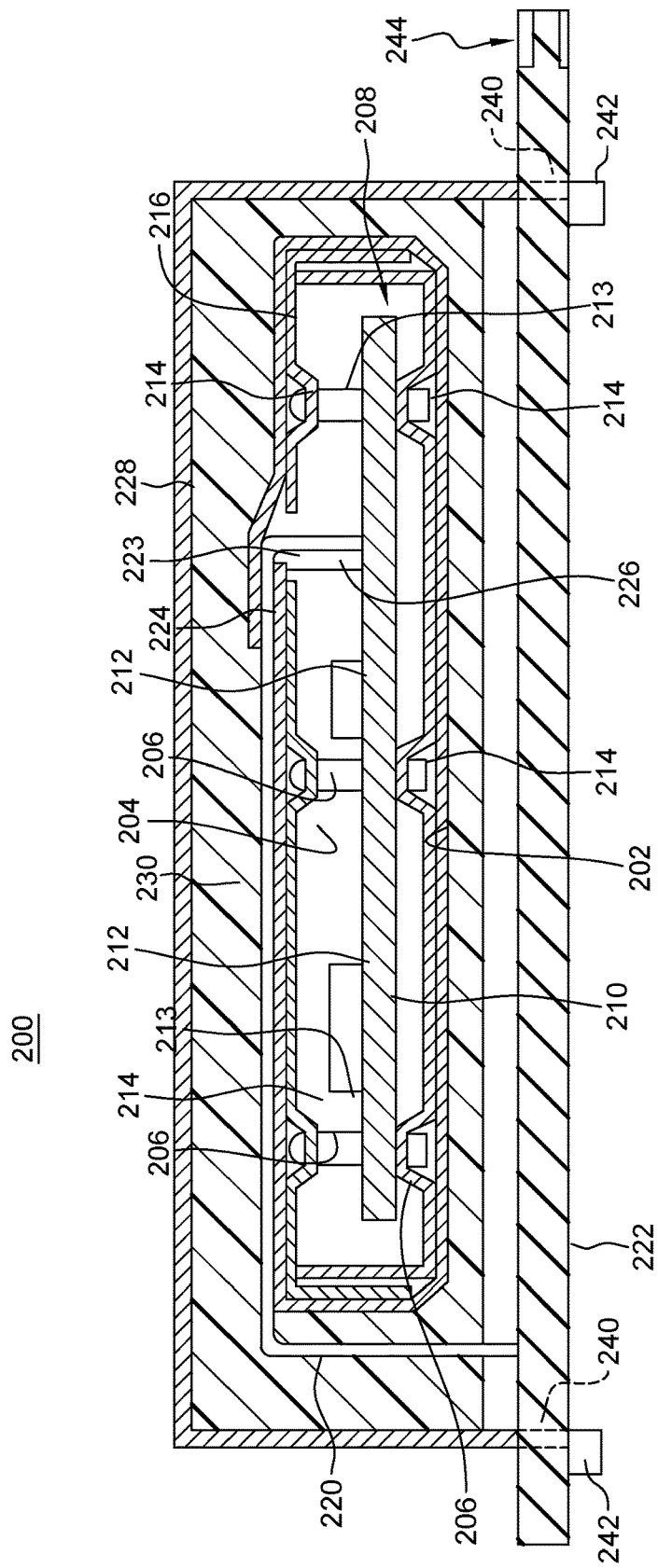
FIG. 2 is a cross-sectional elevational view of one embodiment of a tamper-proof electronic package comprising an electronic circuit.

FIG. 2 depicts in detail one embodiment of a tamper-proof electronic package 200. Electronic package 200 is defined by, for instance, a base metal shell 202 and a top metal shell 204. Outer surfaces of base metal shell 202 and top metal shell 204 may be provided with standoffs 206, with an electronic assembly 208 resting on standoffs 206 defined in base metal shell 202. Electronic assembly 208 may include, for instance, a printed circuit board 210 with electronic components 212 that are electrically connected via conductors (not shown) defined within or on printed circuit board 210.

Hollow spacers 213 may be placed below dimples 206 in top metal shell 204, and rivets 214 provided, extending through openings in dimples 206, through hollow spacers 213 and through openings in printed circuit board 210 to base metal shell 202 in order to fixedly secure electronic assembly 208 within the enclosure formed by base and top metal shells 202, 204. A security mesh or tamper-respondent sensor 216 is wrapped around the top, base, and four sides of the enclosure formed by base and top metal shells 202, 204. As illustrated, in one or more embodiments, top metal shell 204 may have an opening through which a bus 220 extends. One end of bus 220 may be connected to conductors (not shown) on printed circuit board 210, and the other end may be connected to conductors (not shown) on a printed circuit board 222. As bus 220 passes through the opening, the bus extends between an inner edge region 223 of the security mesh 216 and an overlapping, outer edge region 224 of the security mesh 216. A group of wires 226 connect, in one embodiment, security mesh 216 to conductors on printed circuit board 210. Circuitry on printed circuit board 210 is responsive to a break or discontinuity in security sensor array 216, in which case, an alarm signal may be emitted on bus 220, and also encryption/decryption keys stored within electronic assembly 208 may be erased.

In one or more implementations, liquid polyurethane resin may be applied to security mesh 216 and cured. An outer, thermally conductive enclosure 228, such as a copper enclosure, may be filled with liquid polyurethane resin with the electronic assembly and inner enclosure and security mesh suspended within it. Upon curing the resin, the electronic assembly and inner enclosure and security mesh become embedded in a polyurethane block or encapsulant 230, as shown. The enclosure 228 is mounted on the printed circuit board 222, which can be accomplished using, for instance, legs 240 which extend through slots in printed circuit board 222 and terminate in flanges 242, which are then bent out of alignment with the slots. Bus 220 may be connected, by way of printed circuit board 222 to connectors 244 located along, for instance, one edge of printed circuit board 222.

When considering tamper-proof packaging, the electronic package needs to maintain defined tamper-proof requirements, such as those set forth in the National Institutes of Standards and Technology (NIST) Publication FIPS 140-2, which is a U.S. Government Computer Security Standard, used to accredit cryptographic modules. The NIST FIPS 140-2 defines four levels of security, named Level 1 to Level 4, with Security Level 1 providing the lowest level of security, and Security Level 4 providing the highest level of security. At Security Level 4, physical security mechanisms are provided to establish a complete envelope of protection around the cryptographic module, with the intent of detecting and responding to any unauthorized attempt at physical access. Penetration of the cryptographic module enclosure from any direction has a very high probability of being detected, resulting in the immediate zeroization of all plain text critical security parameters (CSPs). Security Level 4 cryptographic modules are useful for operation in physically unprotected environments. Security Level 4 also protects a cryptographic module against a security compromise due to environmental conditions or fluctuations outside of the module's normal operating ranges for voltages and temperature. Intentional excursions beyond the normal operating ranges may be used by an attacker to thwart the cryptographic module's defenses. The cryptographic module is required to either include specialized environmental protection features designed to detect fluctuations and zeroize critical security parameters, or to undergo rigorous environmental failure testing to provide reasonable assurance that the module will not be affected by fluctuations outside of the normal operating range in a manner that can compromise the security of the module.

To address the demands of ever-improving anti-intrusion technology, and the higher-performance encryption/decryption functions being provided, enhancements to the tamper-proof, tamper-evident packaging for the electronic components or circuits at issue are desired. Various enhancements are described hereinbelow to, for instance, tamper-respondent assemblies and tamper-respondent sensors. Note that the numerous inventive aspects described herein may be used singly, or in any desired combination. Additionally, in one or more implementations, the enhancements to tamper-proof electronic packaging described herein may be provided to work within defined space limitations for existing packages. For instance, one or more of the concepts described may be configured to work with peripheral component interconnect express (PCIe) size limits, and the limitations resulting from being capsulated in, for instance, an insulating encapsulant.

Thus, disclosed hereinbelow with reference to FIGS. 3-13 are various approaches and/or enhancements to creating a secure volume for accommodating one or more electronic components, such as one or more encryption and/or decryption modules or circuits and associated components of a communications card or other electronic assembly.

Figure 3:
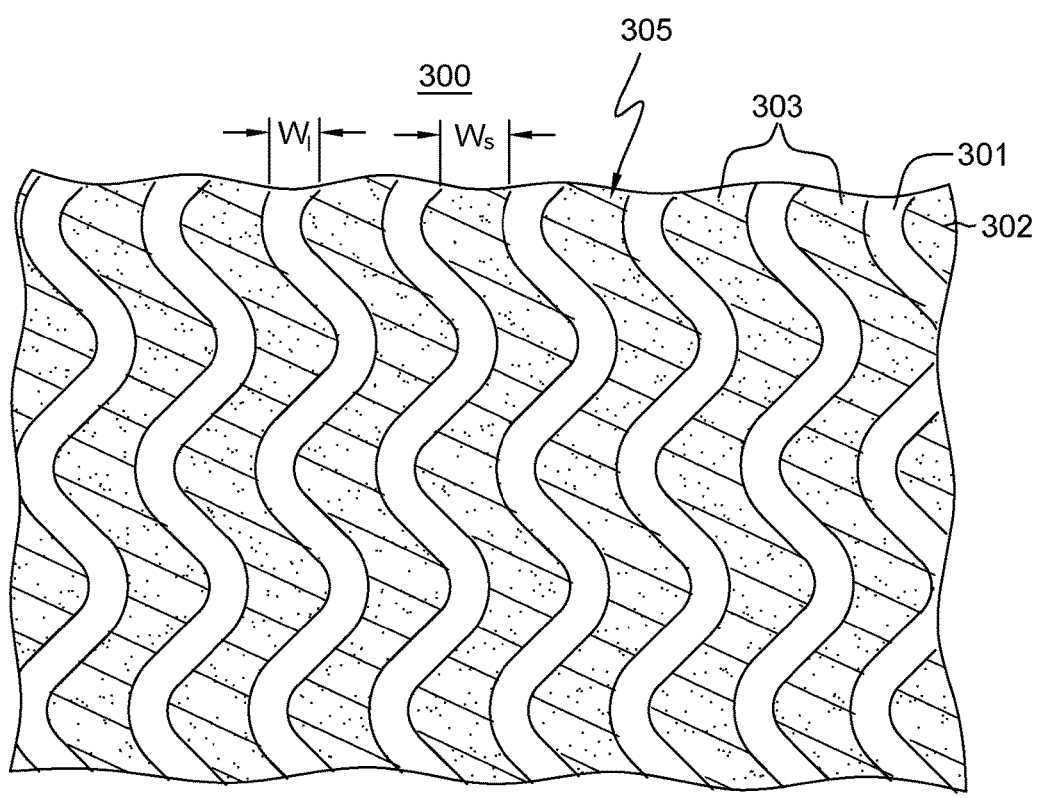
FIG. 3 depicts one embodiment of a tamper-respondent trace pattern or circuit which may be employed within a tamper-respondent sensor, in accordance with one or more aspects of the present invention.

FIG. 3 depicts a portion of one embodiment of a tamper-respondent layer 305 (or laser and pierce-respondent layer) of a tamper-respondent sensor 300 or security sensor, such as discussed herein. In FIG. 3, the tamper-respondent layer 305 includes circuit lines or traces 301 provided on one or both opposite sides of a flexible layer 302, which in one or more embodiments, may be a flexible insulating layer or film. FIG. 3 illustrates circuit lines 301 on, for instance, one side of flexible layer 302, with the traces on the opposite side of the film being, for instance, the same pattern, but (in one or more embodiments) offset to lie directly below spaces 303, between circuit lines 301. As described below, the circuit lines on one side of the flexible layer may be of a line width $W_l$ and have a pitch or line-to-line spacing $W_s$ such that piercing of the layer 305 at any point results in damage to at least one of the circuit lines traces 301. In one or more implementations, the circuit lines may be electrically connected in-series or parallel to define one or more conductors which may be electrically connected in a network to an enclosure monitor, which monitors the resistance of the lines, as described herein. Detection of an increase, or other change, in resistance, caused by cutting or damaging one of the traces, will cause information within the encryption and/or decryption module to be erased. Providing conductive lines 301 in a pattern, such as a sinusoidal pattern, may advantageously make it more difficult to breach tamper-respondent layer 305 without detection. Note, in this regard, that conductive lines 301 could be provided in any desired pattern. For instance, in an alternate implementation, conductive lines 301 could be provided as parallel, straight conductive lines, if desired, and the pattern or orientation of the pattern may vary between sides of a layer, and/or between layers.

As noted, as intrusion technology continues to evolve, anti-intrusion technology needs to continue to improve to stay ahead. In one or more implementations, the above-summarized tamper-respondent sensor 300 of FIG. 3 may be disposed over an outer surface of an electronic enclosure, such as an electronic enclosure described above in connection with FIGS. 1 & 2. Alternatively, as described further herein, the tamper-respondent sensor may cover or line an inner surface of an electronic enclosure to provide a secure volume about at least one electronic component to be protected. Still further, the tamper-respondent sensor, or more particularly, the tamper-detect circuit(s) of the sensor, could be embedded within a multi-layer stack, such as a multi-die stack, as described below. Numerous enhancements to the tamper-respondent sensor itself are described below.

In one or more aspects, disclosed herein is a tamper-respondent sensor 300 with circuit lines 301 having reduced line widths $W_l$ of, for instance, 200 µm, or less, such as less than or equal to 100 µm, or even more particularly, in the range of 30-70 µm. This is contrasted with conventional trace widths, which are typically on the order of 350 µm or larger. Commensurate with reducing the circuit line width $W_l$, line-to-line spacing width $W_s$ 303 is also reduced to less than or equal to 200 µm, such as less than or equal to 100 µm, or for instance, in a range of 30-70 µm. Advantageously, by reducing the line width $W_l$ and line-to-line spacing $W_s$ of circuit lines 301 within tamper-respondent sensor 300, the circuit line width and pitch is on the same order of magnitude as the smallest intrusion instruments currently available, and therefore, any intrusion attempt will necessarily remove a sufficient amount of a circuit line(s) to cause resistance to change, and thereby the tamper intrusion to be detected. Note that, by making the circuit line width of the smaller dimensions disclosed herein, any cutting or damage to the smaller-dimensioned circuit line will also be more likely to be detected, that is, due to a greater change in resistance. For instance, if an intrusion attempt cuts a 100 µm width line, it is more likely to reduce the line width sufficiently to detect the intrusion by a change in resistance. A change in a narrower line width is more likely to result in a detectable change in resistance, compared with, for instance, a 50% reduction in a more conventional line width of 350 µm to, for instance, 175 µm. The smaller the conductive circuit line width becomes, the more likely that a tampering of that line will be detected.

Note also that a variety of materials may advantageously be employed to form the circuit lines. For instance, the circuit lines may be formed of a conductive ink (such as a carbon-loaded conductive ink) printed onto one or both opposite sides of one or more of the flexible layers 302 in a stack of such layers. Alternatively, a metal or metal alloy could be used to form the circuit lines, such as copper, silver, intrinsically conductive polymers, carbon ink, or nickel-phosphorus (NiP), or Omega-Ply®, offered by Omega Technologies, Inc. of Culver City, Calif. (USA), or Ticer® offered by Ticer Technologies, Chandler, Ariz. (USA). Note that the process employed to form the fine circuit lines or traces on the order described herein is dependent, in part, on the choice of material used for the circuit lines. For instance, if copper circuit lines are being fabricated, then additive processing, such as plating up copper traces, or subtractive processing, such as etching away unwanted copper between trace lines, may be employed. By way of further example, if conductive ink is employed as the circuit line material, fine circuit lines on the order disclosed herein can be achieved by focusing on the rheological properties of the conductive ink formulation. Further, rather than simple pneumatics of pushing conductive ink through an aperture in a stencil with a squeegee, the screen emulsion may be characterized as very thin (for instance, 150 to 200 µm), and a squeegee angle may be used such that the ink is sheared to achieve conductive ink breakaway rather than pumping the conductive ink through the screen apertures. Note that the screen for fine line width printing such as described herein may have the following characteristics in one specific embodiment: a fine polyester thread for both warp and weave on the order of 75 micrometers; a thread count between 250-320 threads per inch; a mesh thickness of, for instance, 150 micrometers; an open area between threads that is at least 1.5× to 2.0× the conductive ink particle size; and to maintain dimensional stability of the print, the screen snap-off is kept to a minimum due the screen strain during squeegee passage.

In one or more implementations, circuit lines 301 of tamper-respondent sensor 300 are electrically connected to define one or more resistive networks. Further, the circuit lines may include one or more resistive circuit lines by selecting the line material, line width $W_l$ and line length $L_l$, to provide a desired resistance per line. As one example, a "resistive circuit line" as used herein may comprise a line with 1000 ohms resistance or greater, end-to-end. In one specific example, a circuit line width of 50 µm, with a circuit line thickness of 10 µm may be used, with the line length $L_l$ and material selected to achieve the desired resistance. At the dimensions described, good electrical conductors such as copper or silver may also be employed and still form a resistive network due to the fine dimensions noted. Alternatively, materials such as conductive ink or the above-noted Omega-Ply® or Ticer® may be used to define resistive circuit lines.

In a further aspect, the flexible layer 302 itself may be further reduced in thickness from a typical polyester layer by selecting a crystalline polymer to form the flexible layer or substrate. By way of example, the crystalline polymer could comprise polyvinylidene difluoride (PVDF), or Kapton, or other crystalline polymer material. Advantageously, use of a crystalline polymer as the substrate film may reduce thickness of the flexible layer 302 to, for instance, 2 mils thick from a more conventional amorphous polyester layer of, for instance, 5-6 mils. A crystalline polymer can be made much thinner, while still maintaining structural integrity of the flexible substrate, which advantageously allows for far more folding, and greater reliability of the sensor after folding. Note that the radius of any fold or curvature of the sensor is necessarily constrained by the thickness of the layers comprising the sensor. Thus, by reducing the flexible layer thickness to, for instance, 2 mils, then in a four tamper-respondent layer stack, the stack thickness can be reduced from, for instance, 20 mils in the case of a typical polyester film, to 10 mils or less with the use of crystalline polymer films.

One or more aspects of the above-discussed tamper-respondent sensor of FIG. 3 may be employed in the various tamper-respondent assemblies described herein. By way of example, FIGS. 4A-9 depict an alternate approach to creating a secure volume which utilizes one or more tamper-respondent sensors on an inner surface of an enclosure. Further, FIGS. 10-13 depict various embodiments of a multi-layer stack with an embedded tamper-respondent electronic circuit structure comprising one or more tamper-respondent sensors embedded within the discrete component layers of the stack. The tamper-detect circuits of the one or more tamper-respondent sensors of the tamper-respondent assemblies of FIGS. 10-13 may have one or more similar attributes to those described above in connection with FIG. 3, or described below with reference to FIGS. 4A-9.

Figure 4A:
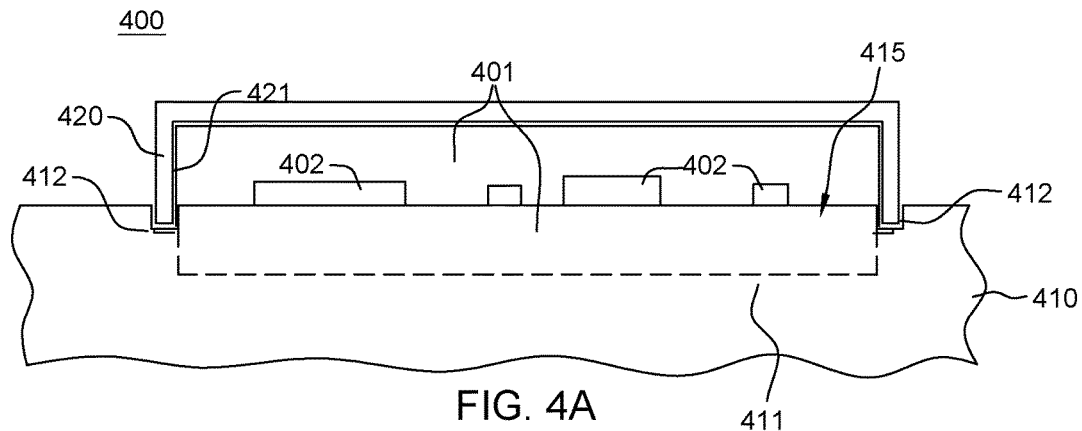
FIG. 4A is a cross-sectional elevational view of another embodiment of a tamper-proof electronic package, which includes a tamper-respondent sensor embedded within a multilayer circuit board, in accordance with one or more aspects of the present invention.
Figure 4B:
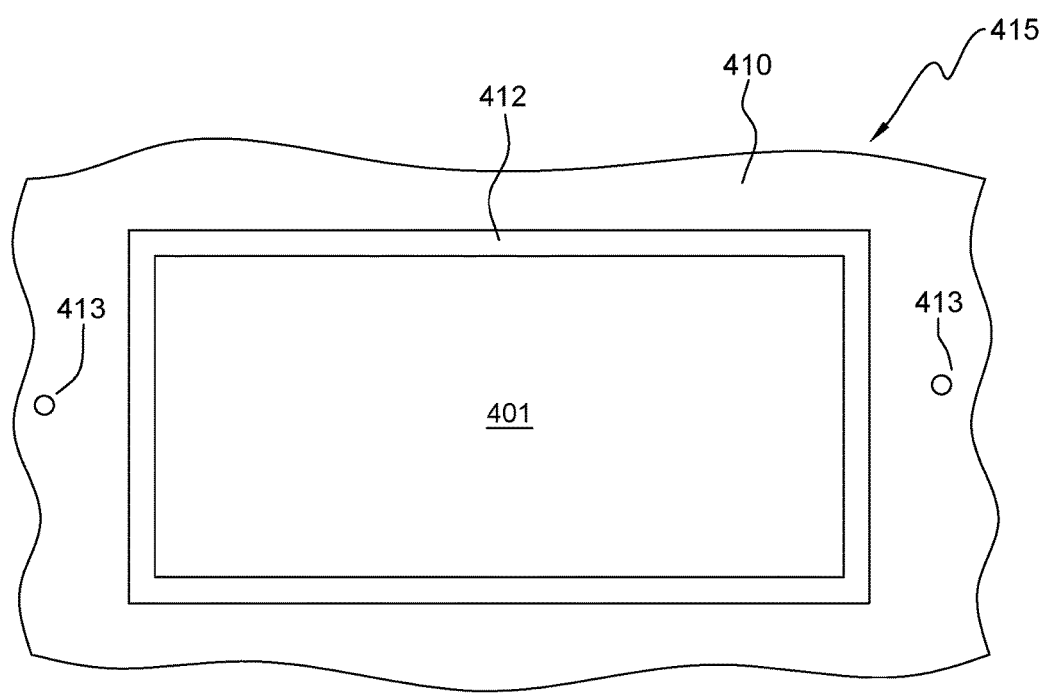
FIG. 4B is a top plan view of the multilayer circuit board of FIG. 4A, depicting one embodiment of the secure volume where defined, in part, within the multilayer circuit board, in accordance with one or more aspects of the present invention.

As noted, FIGS. 4A & 4B depict one embodiment of an electronic package, or tamper-proof electronic package 400, comprising an electronic circuit 415, in accordance with one or more aspects of the present invention.

Referring collectively to FIGS. 4A & 4B, electronic circuit 415 includes a multilayer circuit board 410 which has a tamper-respondent sensor 411 embedded therein that facilitates defining, in part, a secure volume 401 associated with multilayer circuit board 410 that extends into multilayer circuit board 410. In particular, in the embodiment of FIGS. 4A & 4B, secure volume 401 exists partially within multilayer circuit board 410, and partially above multilayer circuit board 410. One or more electronic components 402 are mounted to multilayer circuit board 410 within secure volume 401 and may comprise, for instance, one or more encryption modules and/or decryption modules, and associated components, with the tamper-proof electronic package comprising, in one or more embodiments, a communications card of a computer system.

Tamper-proof electronic package 400 further includes an enclosure 420, such as a pedestal-type enclosure, mounted to multilayer circuit board 410 within, for instance, a continuous groove (or trench) 412 formed within an upper surface of multilayer circuit board 410. In one or more embodiments, enclosure 420 may comprise a thermally conductive material and operate as a heat sink for facilitating cooling of the one or more electronic components 402 within the secure volume. A security mesh 421, such as the above-described security meshes, may be associated with enclosure 420, for example, wrapping around the inner surface of enclosure 420 to facilitate defining, in combination with tamper-respondent sensor 411 embedded within multilayer circuit board 410, secure volume 401. In one or more implementations, security mesh 421 extends down into continuous groove 412 in multilayer circuit board 410 and may, for instance, even wrap partially or fully around the lower edge of enclosure 420 within continuous groove 412 to provide enhanced tamper detection where enclosure 420 couples to multilayer circuit board 410. In one or more implementations, enclosure 420 may be securely affixed to multilayer circuit board 410 using, for instance, a bonding material such as an epoxy or other adhesive.

As depicted in FIG. 4B, one or more external circuit connection vias 413 may be provided within multilayer circuit board 410 for electrically connecting to the one or more electronic components 402 (FIG. 4A) within secure volume 401. These one or more external circuit connection vias 413 may electrically connect to one or more external signal lines or planes (not shown) embedded within multilayer circuit board 410 and extending, for instance, into a secure base region of (or below) secure volume 401, as explained further below. Electrical connections to and from secure volume 401 may be provided by coupling to such external signal lines or planes within the multilayer circuit board 410.

As noted with reference to FIGS. 4A & 4B, secure volume 401 defined in association with multilayer circuit board 410 may be sized to house electronic components 402 to be protected, and be constructed to extend into multilayer circuit board 410. In one or more implementations, multilayer circuit board 410 includes electrical interconnect within the secure volume 401 defined in the board, for instance, for electrically connecting the multiple tamper-respondent layers of the embedded tamper-respondent sensor 411 to associated monitor circuitry also disposed within secure volume 401.

Note that the embodiment depicted in FIGS. 4A & 4B is presented by way of example only. In one or more other implementations, the electronic circuit may comprise multiple multilayer circuit boards, each with a tamper-respondent sensor embedded within the multilayer circuit board with an appropriate connector, located within a secure volume defined between two adjacent multilayer circuit boards, interconnecting selected wiring of the multilayer circuit boards. In such an implementation, the overlying multilayer circuit board could be hollowed out to accommodate, for instance, the connector and/or one or more other electronic components between the multilayer circuit boards. In addition, other configurations of enclosure 420, and/or other approaches to coupling enclosure 420 and multilayer circuit board 410 may be employed.

Figure 5A:
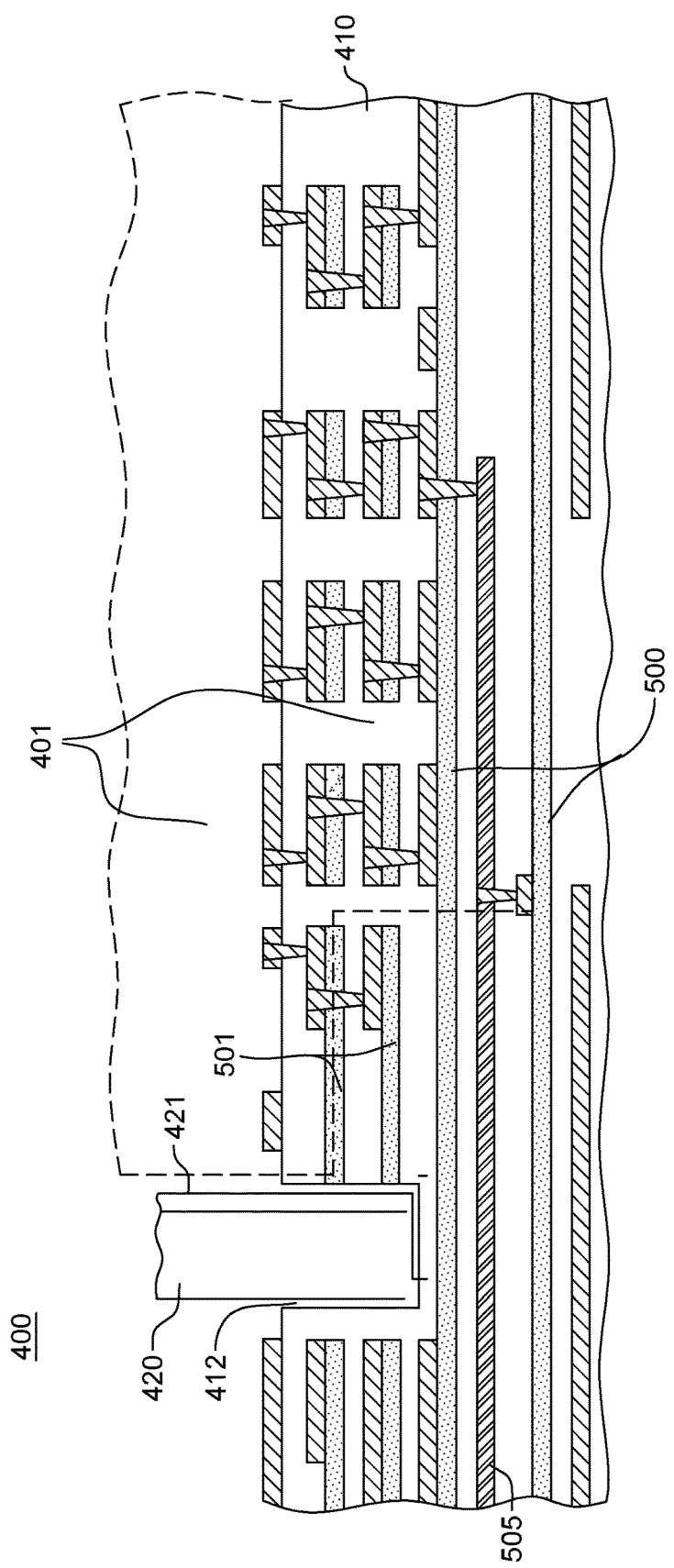
FIG. 5A is a partial cross-sectional elevational view of a tamper-proof electronic package comprising an electronic circuit with a multilayer circuit board and embedded tamper-respondent sensor, in accordance with one or more aspects of the present invention.

By way of further example, FIG. 5A depicts a partial cross-sectional elevational view of one embodiment of multilayer circuit board 410 and enclosure 420. In this configuration, the embedded tamper-respondent sensor includes multiple tamper-respondent layers including, by way of example, at least one tamper-respondent mat (or base) layer 500, and at least one tamper-respondent frame 501. In the example depicted, two tamper-respondent mat layers 500 and two tamper-respondent frame 501 are illustrated, by way of example only. The lower-most tamper-respondent mat layer 500 may be a continuous sense or detect layer extending completely below the secure volume being defined within multilayer circuit board 410. One or both tamper-respondent mat layers 500 below secure volume 401 may be partitioned into multiple circuit zones, as discussed further below. Within each tamper-respondent mat layer, or more particularly, within each circuit zone of each tamper-respondent mat layer, multiple circuits or conductive traces are provided in any desired configuration, such as the configuration described above in connection with FIG. 3. Further, the conductive traces within the tamper-respondent layers may be implemented as, for instance, a resistive layer which is difficult to attach shunt circuits to, as explained further below.

As illustrated, one or more external signal lines or planes 505 enter secure volume 401 between, in this embodiment, two tamper-respondent mat layers 500, and then electrically connect upwards into the secure volume 401 through one or more conductive vias, arranged in any desired location and pattern. In the configuration depicted, the one or more tamper-respondent frames 501 are disposed at least inside of the area defined by continuous groove 412 accommodating the base of enclosure 420. Together with security mesh 421 associated with enclosure 420, tamper-respondent frames 501 define secure volume 401 where extending, in part, into multilayer circuit board 410. With secure volume 401 defined, at least in part, within multilayer circuit board 410, the external signal line(s) 505 may be securely electrically connected to, for instance, the one or more electronic components 402 (FIG. 4A) mounted to multilayer circuit board 410 within secure volume 401. In addition, the secure volume 401 may accommodate electrical interconnection of the conductive traces of the multiple tamper-respondent layers, for instance, via appropriate monitor circuitry.

Figure 5B:
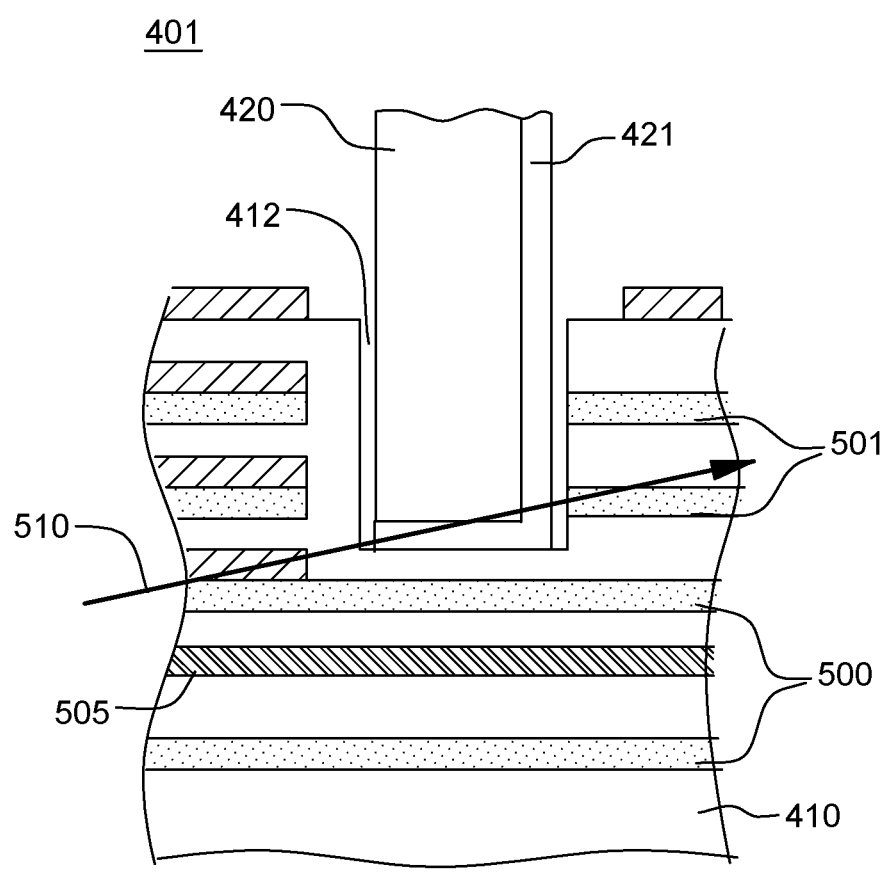
FIG. 5B is a schematic of a portion of the tamper-proof electronic package of FIG. 5A, in accordance with one or more aspects of the present invention.

As illustrated by the schematic of FIG. 5B, added security may be provided by extending tamper-respondent mat layers 500 (and if desired, tamper-respondent frames 501) outward past continuous groove 412 accommodating enclosure 420. In this manner, a line of attack 510 may be made more difficult at the interface between enclosure 420 and multilayer circuit board 410 since the attack 510 would need to clear tamper-respondent mat layers 500, the bottom edge of security mesh 421 associated with enclosure 420, as well as the tamper-respondent frames 501 of the embedded tamper-respondent sensor.

Figure 5C:
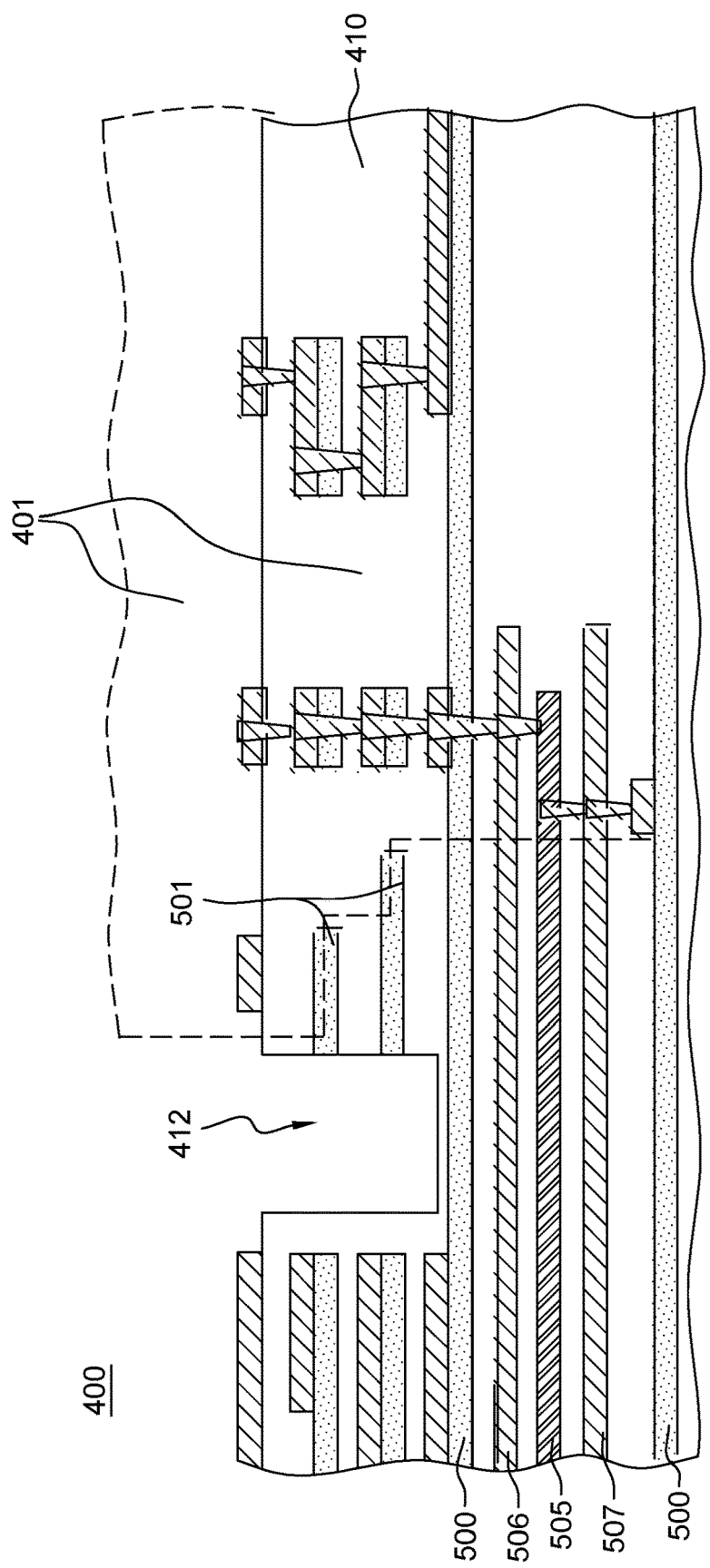
FIG. 5C depicts an alternate embodiment of an electronic circuit comprising a multilayer circuit board and an embedded tamper-respondent sensor, in accordance with one or more aspects of the present invention.

FIG. 5C depicts a variation on the multilayer circuit board 410 of FIG. 5A. In this embodiment, the embedded tamper-respondent sensor again includes multiple tamper-respondent mat layers 500 and multiple tamper-respondent frames 501, such as described above. Additionally, a tri-plate structure is provided comprising one or more external signal lines or layers 505 sandwiched between an upper ground plane 506 and a lower ground plane 507. In this configuration, high-speed transfer of signals to and from the secure volume, and in particular, to and from the one or more electronic components resident within the secure volume, are facilitated.

Note also that, in this implementation, once within the secure volume is defined within multilayer circuit board 410, conductive vias within the secure volume between layers of multilayer circuit board 410 may be either aligned, or offset, as desired, dependent upon the implementation. Alignment of conductive vias may facilitate, for instance, providing a shortest connection path, while offsetting conductive vias between layers may further enhance security of the tamper-proof electronic package by making an attack into the secure volume through or around one or more tamper-respondent layers of the multiple tamper-respondent layers more difficult.

Each tamper-respondent layer of the embedded tamper-respondent sensor formed within the multilayer circuit board of the electronic circuit or electronic package may include multiple conductive traces or lines formed between, for instance, respective sets of input and output contacts or vias at the trace termination points. Any number of conductive traces or circuits may be employed in defining a tamper-respondent layer or a tamper-respondent circuit zone within a tamper-respondent layer. For instance, 4, 6, 8, etc., conductive traces may be formed in parallel (or otherwise) within a given tamper-respondent layer or circuit zone between the respective sets of input and output contacts to those conductive traces.

Figure 6:
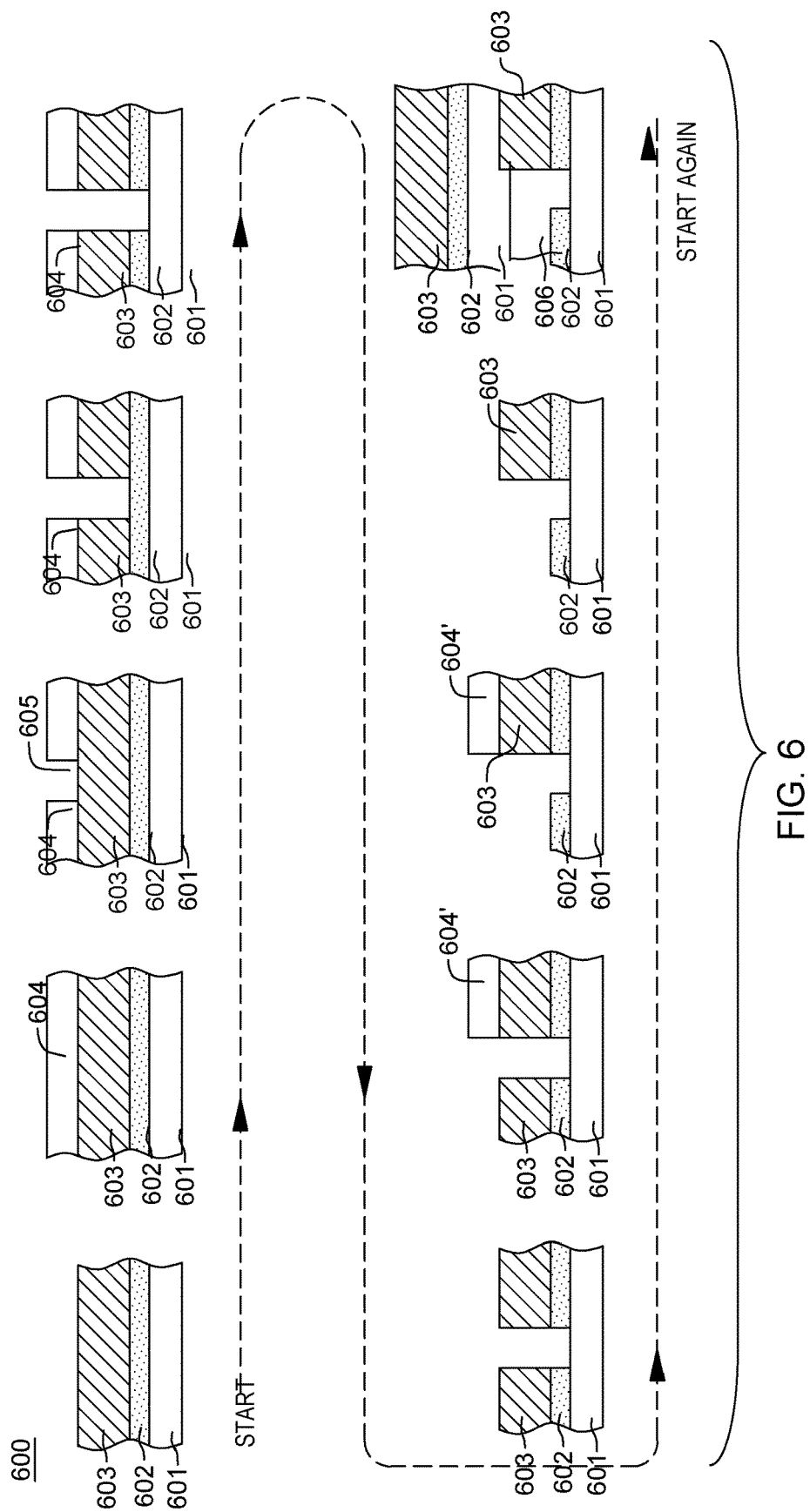
FIG. 6 illustrates one embodiment of a process for fabricating a multilayer circuit board with an embedded tamper-respondent sensor, in accordance with one or more aspects of the present invention.

In one or more implementations, the multilayer circuit board may be a multilayer wiring board or printed circuit board formed, for instance, by building up the multiple layers of the board. FIG. 6 illustrates one embodiment for forming and patterning a tamper-respondent layer within such a multilayer circuit board.

As illustrated in FIG. 6, in one or more implementations, a tamper-respondent layer, such as a tamper-respondent mat layer or a tamper-respondent frame disclosed herein, may be formed by providing a material stack comprising, at least in part, a structural layer 601, such as a pre-preg (or pre-impregnated) material layer, a trace material layer 602 for use in defining the desired trace patterns, and an overlying conductive material layer 603, to be patterned to define conductive contacts or vias electrically connecting to the pattern of traces being formed within the trace material layer 602, for instance, at trace terminal points. In one or more implementations, the trace material layer 602 may comprise nickel phosphorous (NiP), and the overlying conductive layer 603 may comprise copper. Note that these materials are identified by way of example only, and that other trace and/or conductive materials may be used within the build-up layer or stack 600.

A first photoresist 604 is provided over stack 600, and patterned with one or more openings 605, through which the overlying conductive layer 603 may be etched. Depending on the materials employed, and the etch processes used, a second etch process may be desired to remove portions of trace material layer 602 to define the conductive traces of the subject tamper-respondent layer. First photoresist 604 may then be removed, and a second photoresist 604' is provided over the conductive layer 603 features to remain, such as the input and output contacts. Exposed portions of conductive layer 603 are then etched, and the second photoresist 604' may be removed, with any opening in the layer being filled, for instance, with an adhesive (or pre-preg) and a next build-up layer is provided, as shown. Note that in this implementation, most of overlying conductive layer 603 is etched away, with only the conductive contacts or vias remaining where desired, for instance, at the terminal points of the traces formed within the layer by the patterning of the trace material layer 602. Note that any of a variety of materials may be employed to form the conductive lines or traces within a tamper-respondent layer. Nickel-phosphorous (NiP) is particularly advantageous as a material since it is resistant to contact by solder, or use of a conductive adhesive to bond to it, making it harder to bridge from one circuit or trace to the next during an attempt to penetrate into the protected secure volume of the electronic circuit. Other materials which could be employed include OhmegaPly®, offered by Ohmega Technologies, Inc., of Culver City, Calif. (USA), or Ticer™, offered by Ticer Technologies of Chandler, Ariz. (USA).

Figure 7:
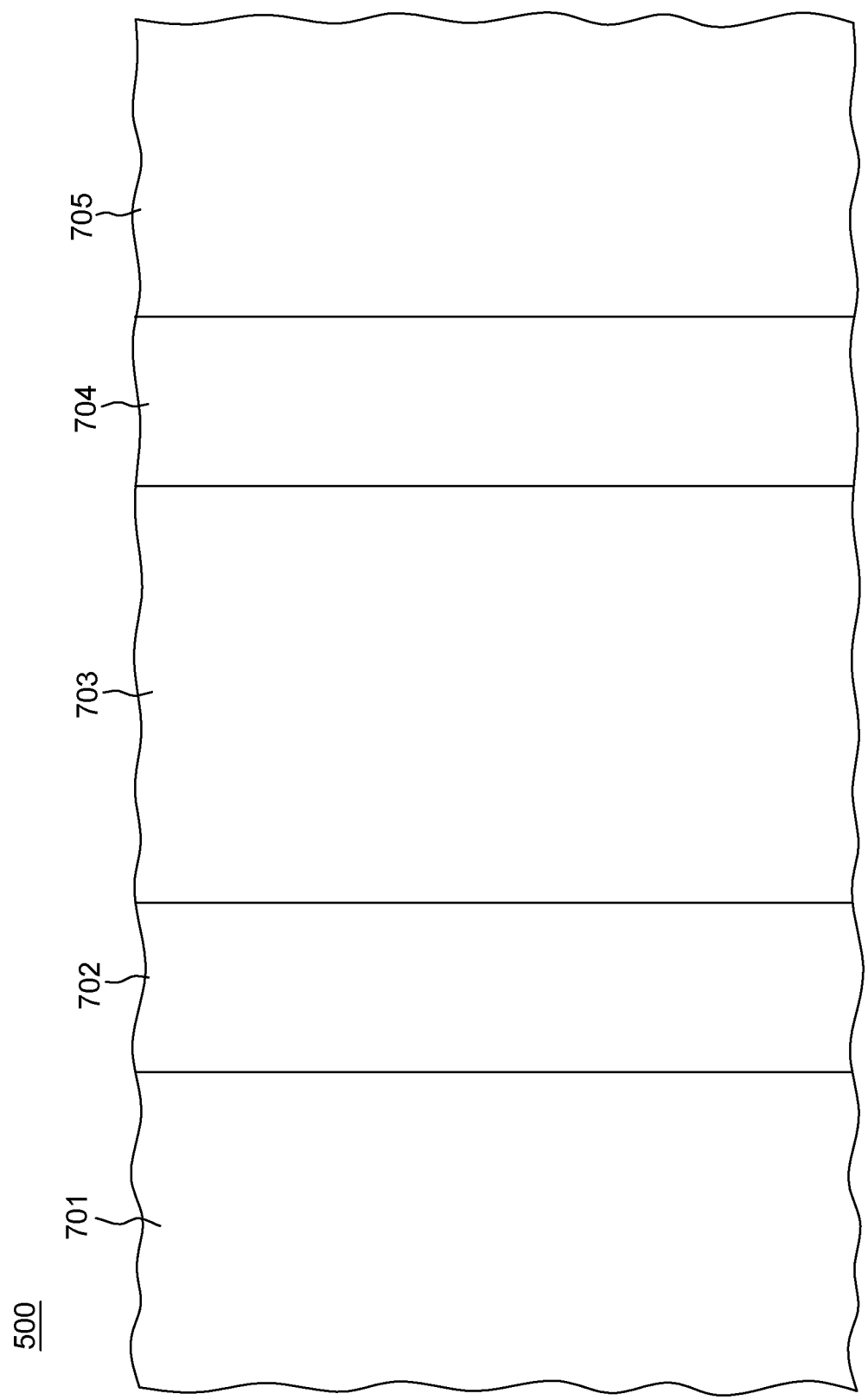
FIG. 7 is a plan view of one embodiment of a tamper-respondent mat layer for a tamper-respondent sensor embedded within a multilayer circuit board, in accordance with one or more aspects of the present invention.

By way of example, FIG. 7 is a partial plan view of one embodiment of a tamper-respondent mat layer 500 of an embedded tamper-respondent sensor within a multilayer circuit board, in accordance with one or more aspects of the present invention. In this implementation, tamper-respondent mat layer 500 is divided into multiple tamper-respondent circuit zones 701, 702, 703, 704, 705, of varying sizes. Within each tamper-respondent circuit zone 701, 702, 703, 704, 705, conductive traces of the same or different wiring patterns may be provided with, for instance, the larger circuit zones 701, 703, 705, having a same number of traces and similar resistance per trace, per zone. Note that other configurations of tamper-respondent sense zones may be employed, including, for instance, equal or standard-sized circuit zones within a common tamper-respondent layer.

FIGS. 8A-8G depict, by way of example, one embodiment of multiple tamper-respondent layers, and the electrical interconnect associated with the tamper-respondent layers, such as for, for instance, the embedded tamper-respondent sensor depicted in FIG. 5A.

Figure 8A:
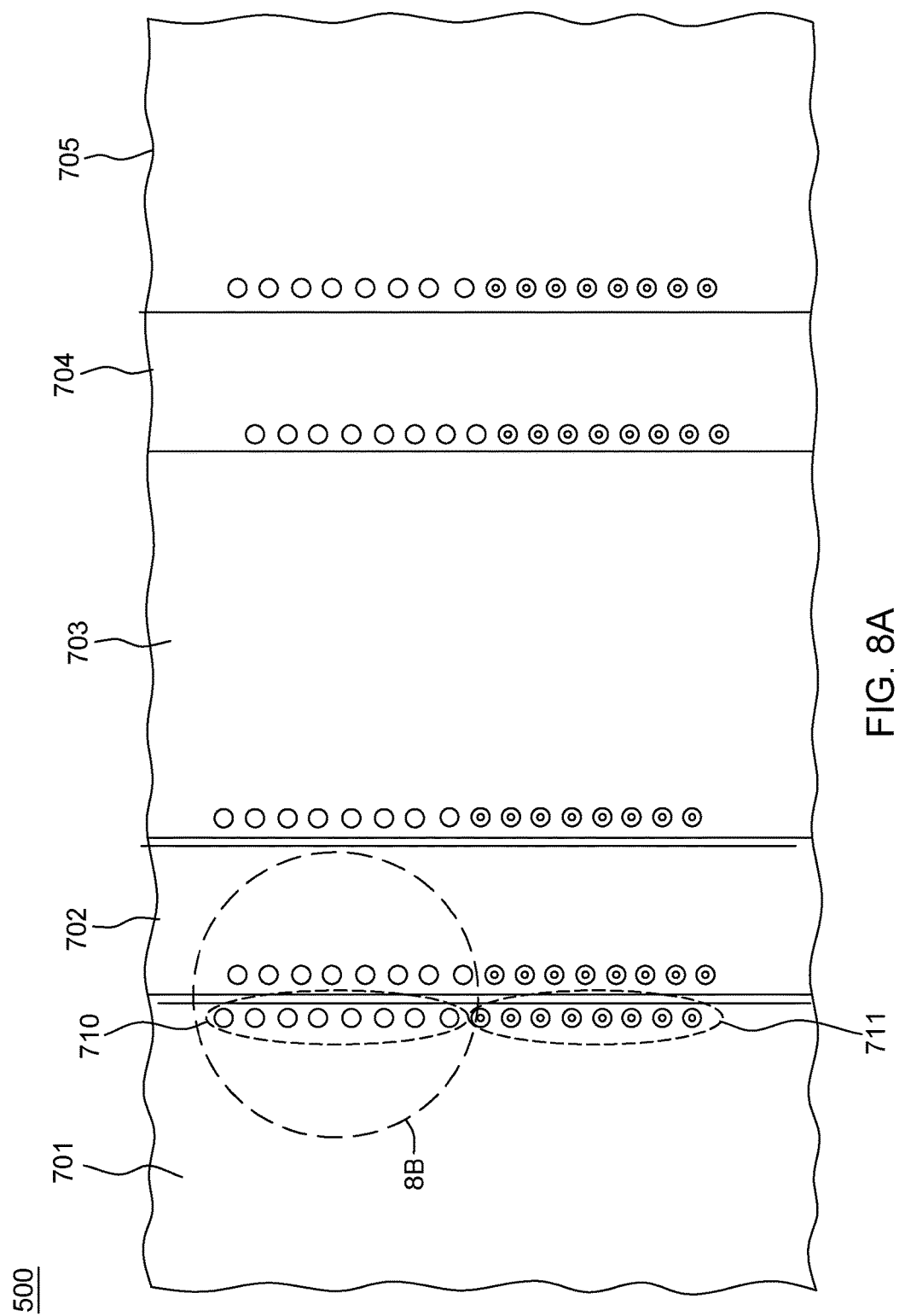
FIG. 8A is a plan view of the tamper-respondent mat layer of FIG. 7, with conductive vias to an upper layer illustrated for electrically connecting to the conductive traces of the different circuit zones of the tamper-respondent mat layer, in accordance with one or more aspects of the present invention.

As illustrated in FIG. 8A, blind contact vias 710, 711 are provided, by way of example, at the edge or boundary of each tamper-respondent circuit zone 701, 702, 703, 704, 705 within a lowermost tamper-respondent mat layer 500. Contact vias 710, 711 facilitate electrical connection from the ends of the conductive traces (not shown) of the depicted tamper-respondent layer upwards into the secure volume for connection to appropriate monitor circuitry in any desired configuration. Note with respect to FIG. 8A, that there are no penetrations through the lowermost tamper-respondent mat layer 500. As explained further below, in one or more implementations, electrical interconnect may be provided above the lowermost tamper-respondent mat layer to shift the overlying contact vias to, for instance, the centers of tamper-respondent circuit zones 702, 704, for instance, to prevent direct penetration of one tamper-respondent layer from passing through other tamper-respondent layers. As noted, any desired number and size of circuit zones of traces may be defined within a tamper-respondent layer. In one or more implementations, a tamper-respondent mat layer may include, for instance, 20, 30, 40, or more, tamper-respondent circuit zones within the layer, each with a same number of traces.

Figure 8B:
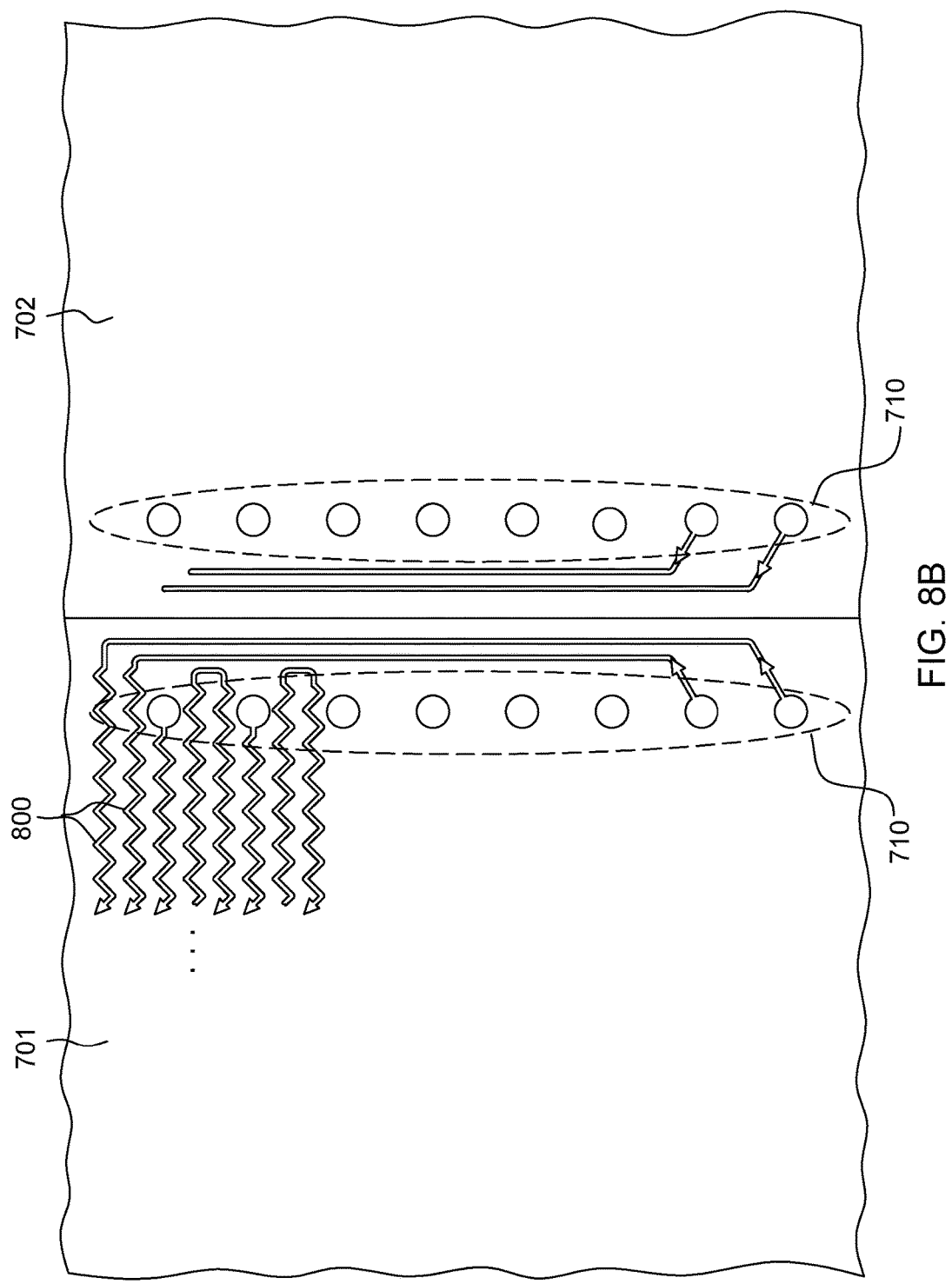
FIG. 8B is a partial plan view of the tamper-respondent mat layer of FIG. 8A, showing a portion of the conductive traces provided within two adjacent circuit zones of the tamper-respondent mat layer, in accordance with one or more aspects of the present invention.

FIG. 8B is a partial enlarged depiction of tamper-respondent mat layer 500 of FIG. 8A, showing a partial boundary between two tamper-respondent circuit zones 701, 702, with input contacts or vias 710 depicted. In this example, an 8-band trace pattern of conductive traces or lines 800 is partially shown within circuit zones 701, 702. As noted, the pattern of conductive traces 800 may be provided in any desired configuration and include, for instance, saw-tooth or sinusoidal line portions within the respective circuit zones 701, 702. FIG. 8B depicts an example of the start of a pattern of the conductive traces 800 where connected to input contacts or vias 710. Configuring conductive traces 800 as illustrated further enhances security by making it harder to reach multiple vias to jump over or shut sections of circuitry within a particular tamper-respondent layer of the embedded tamper-respondent sensor. In one or more implementations the trace fill pattern is dense. Further, line-to-line or trace-to-trace spacing between the different circuit zones of a particular tamper-respondent layer may be the same as that employed within a particular tamper-respondent circuit zone.

FIG. 8C depicts an electrical interconnect layer over tamper-respondent mat layer 500 of FIG. 8A, with wiring illustrated to shift the conductive contacts to offset the vias to, by way of example, the middle of tamper-respondent circuit zones 702, 704. Additionally, this interconnect layer may comprise the external signal lines and contacts for connecting to and from the secure volume to external the secure volume, including, if desired, the provision of one or more high-speed interconnect circuits sandwiched between, for instance, respective ground planes, such as noted above with reference to the exemplary embodiment of FIG. 5C. As illustrated, conductive lines 811 may be provided in this layer electrically connecting contacts 710, 711 of the respective tamper-respondent circuit zones to offset vias 812, 813 disposed, for instance, in alignment 810 over tamper-respondent circuit zones 702, 704. In addition, one or more external signal line contacts 815 may also be provided in this electrical interconnect layer for facilitating electrical connection of the external signal lines into the secure volume.

Figure 8D:
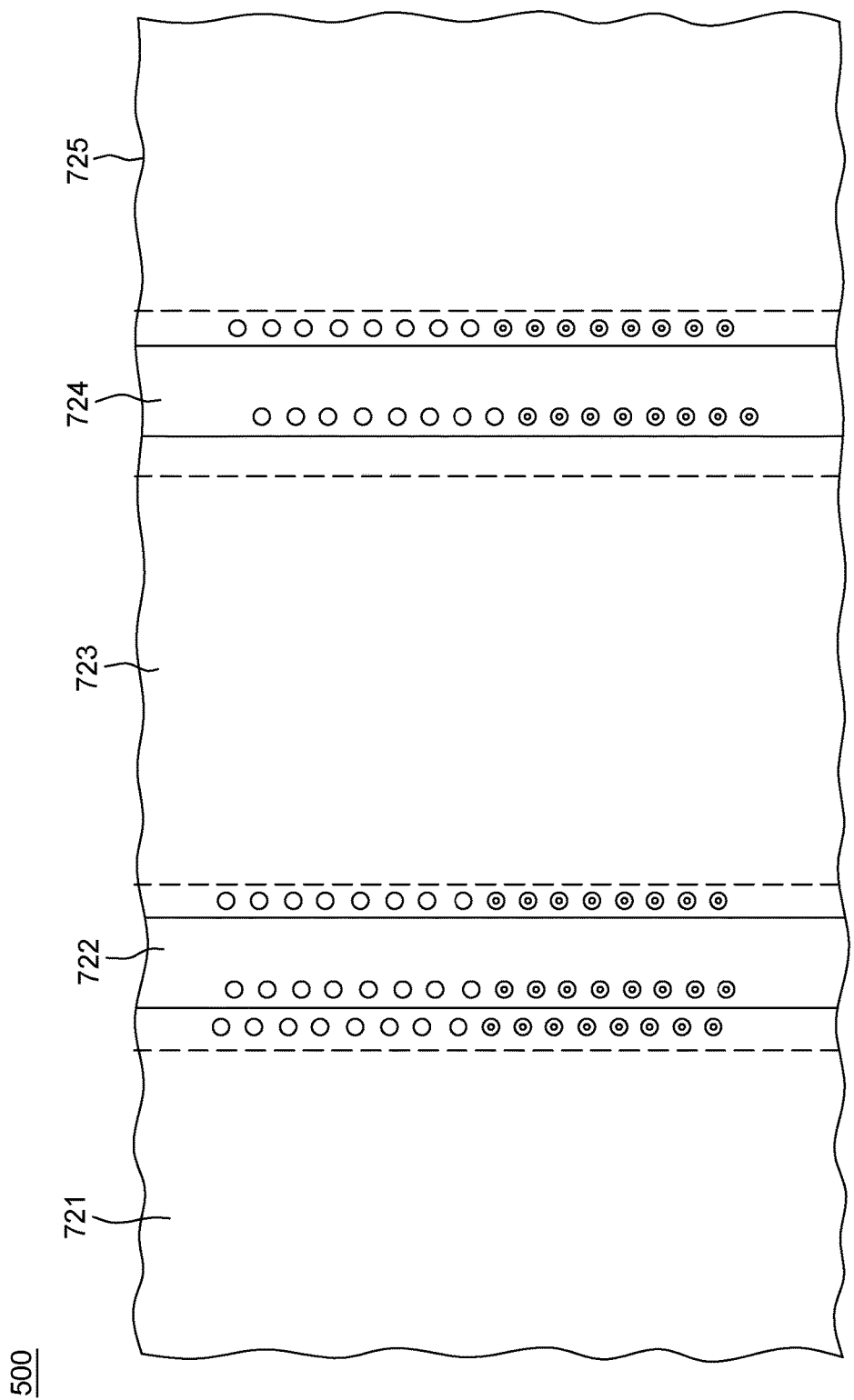
FIG. 8D depicts a tamper-respondent mat layer above the wiring layer of FIG. 8C, and illustrates further offsetting of conductive vias, from one mat layer to the next, to enhance security of the tamper-respondent sensor, in accordance with one or more aspects of the present invention.

FIG. 8D depicts a second tamper-respondent mat layer 500, which in this example, is disposed above tamper-respondent mat layer 500 discussed above in connection with FIGS. 8A & 8B. This second tamper-respondent mat layer 500 is similar to the first except, in the depicted embodiment, the sizes of the tamper-respondent circuit zones 721, 722, 723, 724, 725, are different from the tamper-respondent circuit zones 701, 702, 703, 704, 705, of the tamper-respondent mat layer 500 of FIGS. 8A & 8B. Thus, the boundaries between the tamper-respondent circuit zones between the different layers are offset. This advantageously reduces the opportunity to penetrate both tamper-respondent mat layers along a zone boundary or seam. Depending upon the implementation, electrical contacts to the depicted circuit vias or contacts in the tamper-respondent circuit zones depicted may extend directly upwards into the secure volume. Alternatively, contact vias may be further offset into, for instance, the center lines of tamper-respondent circuit zones 722, 724, in a manner similar to that described above in connection with FIG. 8C. As described above, within each tamper-respondent circuit zone 721-725, a pattern of conductive traces (not shown) is provided. In one or more implementations, tamper-respondent mat layer 500 depicted in FIG. 8D may again comprise any desired number of circuit zones, such as 20, 30, 40, or more, circuit zones, each of which electrically connects within the secure volume in any desired monitor circuitry configuration. Note also that, in one or more embodiments, contacts or vias from the signal layer(s) and/or the lowermost tamper-respondent may layer, may extend through this second tamper-respondent mat layer.

Figure 8E:
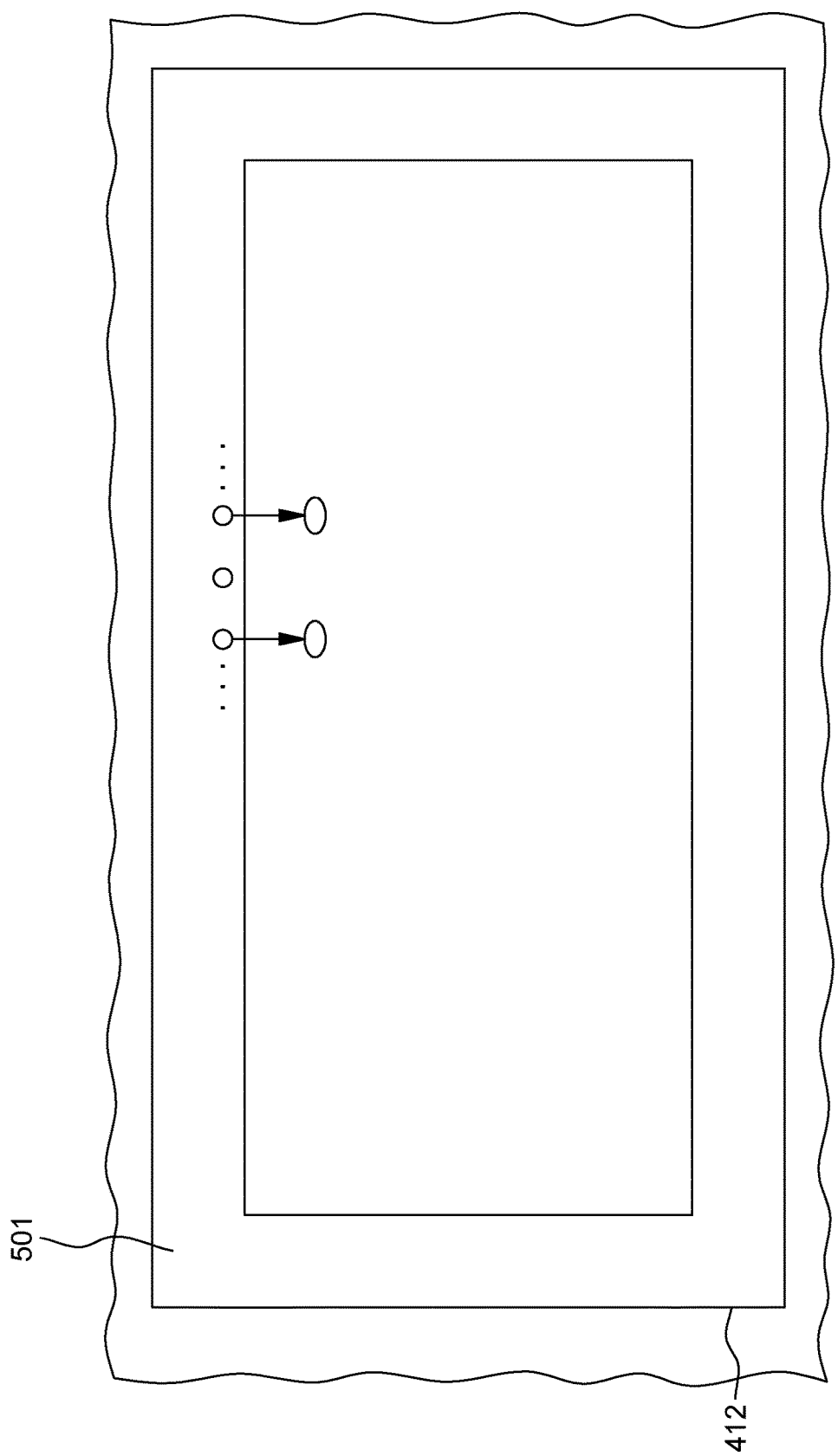
FIG. 8E is a plan view of a first tamper-respondent frame above the tamper-respondent mat layer of FIG. 8D, which facilitates defining, in part, the secure volume within the multilayer circuit board, in accordance with one or more aspects of the present invention.

FIG. 8E depicts an exemplary embodiment of a tamper-respondent frame 501 of a tamper-respondent sensor, in accordance with one or more aspects of the present invention. Tamper-respondent frame 501 resides over the tamper-respondent mat layers 500 described above in connection with FIGS. 8A-8D, and is in one or more embodiments, a picture frame-type layer which completely encircles, and thus serves to define, the secure volume 401 (FIGS. 4A & 5A) within the multilayer circuit board. The tamper-respondent frame illustrated may be a first tamper-respondent frame 501, which provides protective sense wiring or traces, either on the inside or the outside of the enclosure 420 (see FIGS. 4A & 5A), where coupled to the continuous groove or trench within the multilayer circuit board.

FIG. 8F depicts an exemplary embodiment of conductive contacts or vias 710, 711 for tamper-respondent frame 501 of FIG. 8E, with four trace lines being depicted, by way of example only. As illustrated, the input contacts 710 and output contacts 711 at the trace terminal points in a particular zone may be disposed in close proximity with the trace lines 801 of tamper-respondent frame 501, and overlap or double back at the seam to minimize possibility of a successful attack through tamper-respondent frame 501 at the seam.

FIG. 8G depicts a second tamper-respondent frame 501, which in one or more embodiments, overlies the first tamper-respondent frame 501 of FIG. 8E (in the example of FIG. 5A), and which may be identical to the first tamper-respondent frame, except rotated 180° so that the wiring contacts 710, 711 are separated from the layer below, as illustrated. As with the tamper-respondent mat layers 500, tamper-respondent frames 501 may be divided into distinct circuit zones to, for instance, further enhance security. For instance, 2, 4, 6, or more, circuit zones may be defined within a particular tamper-respondent frame 501, each with a plurality of conductive traces defined between input contacts 710 and output contacts 711 at the trace terminal points.

Figure 9:
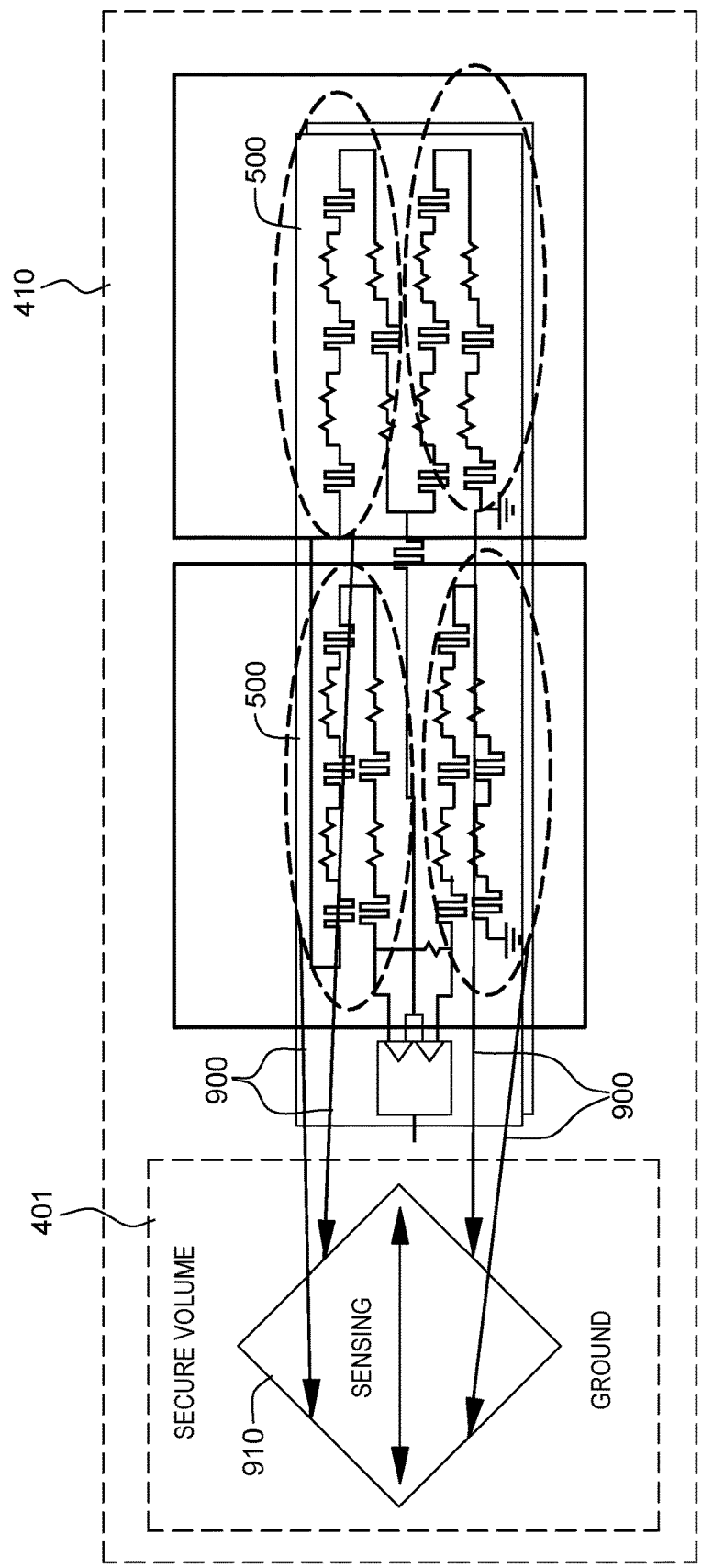
FIG. 9 is a schematic illustration of one embodiment of monitor circuitry and electrical interconnection of different circuit zones of different tamper-respondent layers of the tamper-respondent sensor within the secure volume associated with the multilayer circuit board, in accordance with one or more aspects of the present invention.

The trace lines or circuits within all of the tamper-respondent layers, and in particular, the tamper-respondent circuit zones, of the embedded tamper-respondent sensor are electrically connected into monitor or compare circuitry 900 provided, for instance, within secure volume 401 of multi-layer circuit board 410, as illustrated in FIG. 9. Monitor circuitry 900 may include various bridge or compare circuits, and conventional printed wiring board electrical interconnect inside the secure volume 401, for instance, located within the secure volume defined by the tamper-respondent frames 501 (FIG. 5A), and the tamper-respondent mat layers.

Note that advantageously, different tamper-respondent circuit zones on different tamper-respondent layers may be electrically interconnected into, for instance, the same comparator circuit or Wheatstone bridge of the monitor circuitry. Thus, any of a large number of interconnect configurations may be possible. For instance, if each tamper-respondent mat layer contains 30 tamper-respondent circuit zones, and each tamper-respondent frame contains four tamper-respondent circuit zones, then, for instance, the resultant sixty-eight tamper-respondent circuit zones may be connected in any configuration within the secure volume to create the desired arrangement of circuit networks within the secure volume being monitored for changes in resistance or tampering. Note in this regard, that the power supply or battery for the tamper-respondent sensor may be located external to the secure volume, with the sensor being configured to trip and destroy any protected or critical data if the power supply or battery is tampered with.

By way of further enhancement, FIGS. 10-13 depict various further embodiments of a tamper-respondent assembly or tamper-proof electronic package, in accordance with one or more aspects of the present invention. In these configurations, rather than overlying or surrounding the electronic component(s) or assembly to be protected, the sensor array or circuitry of the tamper-respondent electronic circuit structure is embedded directly within a 2.5D or 3-D multi-layer stack comprising one or more electronic components or circuits to be protected. Note that as used herein, a "component layer" of the multi-layer stack refers to, for instance, a die, an integrated circuit chip, a wafer, an integrated circuit layer, etc., comprising one or more electronic circuits. By way of specific example, one or more electronic circuits to be protected within the secure volume may comprise an encryption module and/or decryption module with associated circuits, such as memory, cache, etc.

In general, a tamper-respondent assembly in this embodiment includes a multi-layer stack comprising multiple discrete component layers stacked and electrically connected together via a plurality of electrical contacts in between the component layers; and a tamper-respondent electronic circuit structure embedded within the multi-layer stack. The tamper-respondent electronic circuit structure includes at least one tamper-respondent sensor embedded, at least in part, within at least one component layer of the multiple discrete component layers of the multi-layer stack. The tamper-respondent electronic circuit structure defines a secure volume within the multi-layer stack. As noted, in one or more implementations, there may be two or more component layers (e.g., two or more die, chips, wafers, or other substrates with electronic circuitry, etc.) in the multi-layer stack.

In one or more implementations, the multi-layer stack includes a first component layer, at least one in-between component layer, and a second component layer, stacked together. The at least one in-between component layer is disposed in between the first component layer and the second component layer in the multi-layer stack, and the tamper-respondent electronic circuit structure is associated with, for instance, embedded at least in part within, the first component layer, the at least one in-between component layer, and the second component layer, with the secure volume being, at least in part, defined within the at least one in-between component layer.

By way of example, the at least one tamper-respondent sensor may include at least one lower tamper-detect circuit within the first component layer, and at least one upper tamper-detect circuit within the second component layer. Further, the at least one tamper-respondent sensor may include at least one peripheral tamper-detect circuit defined, at least in part, by a plurality of through-substrate vias extending through the at least one in-between component layer. The at least one upper tamper-detect circuit, the at least one lower tamper-detect circuit, and the at least one peripheral tamper-detect circuit electrically connect to monitor circuitry of the tamper-respondent electronic circuit structure, and facilitate defining the secure volume within the multi-layer stack. The monitor circuitry itself may be disposed within the secure volume defined within the multi-layer stack.

In one or more examples, the at least one peripheral tamper-detect circuit may extend between the at least one upper tamper-detect circuit and the at least one lower tamper-detect circuit, and be disposed about the periphery of the at least one in-between component layer. In one or more embodiments, the multi-layer stack may further include or reside on a base component layer, with the base component layer being (for example) a 2.5D interposer. In one or more other implementations, the base component layer may be a more typical chip substrate layer, such as interconnect fan-out substrate to which a chip or a chip stack is mounted. Still further, in one or more embodiments, the multi-layer stack could mount directly to a circuit board, without an intervening base component layer.

In one or more implementations, the multi-layer stack may include multiple in-between component layers disposed between the first component and the second component layer. Further, the at least one tamper-respondent sensor may include at least one peripheral tamper-detect circuit which includes, or is defined by, respective pluralities of through-substrate vias, each plurality of through-substrate vias extending through a respective component layer of the multiple in-between component layers. At least some through-substrate vias of the respective pluralities of through-substrate vias are aligned, and are electrically interconnected in the at least one peripheral tamper-detect circuit by respective electrical contacts of the plurality of electrical contacts disposed in between component layers of the multilayer stack. Further, a conventional under-fill material may be disposed between adjacent component layers of the multiple discrete component layers. The under-fill material may surround, at least in part, electrical contacts of the plurality of electrical contacts in between the component layers, including electrical contacts forming part of the at least one peripheral tamper-detect circuit.

In one or more implementations, the at least one tamper-respondent sensor embedded, at least partially, within the at least one component layer, may comprise multiple aligned or stacked tamper-detect circuits within the one component layer of the at least one component layer of the multi-layer stack. For instance, multiple mat-type, tamper-detect circuits may be disposed in a first, lower component layer and/or a second, upper component layer of the multi-layer stack. As a specific example, one or more mat-type, tamper-detect circuits may be disposed adjacent to each main surface of the two opposing main surfaces of the component layer, for instance, in a lower component layer or upper component layer of the multi-layer stack facilitating defining the secure volume therein. In one or more embodiments, the tamper-respondent electronic circuit structure is fully embedded within the multi-layer stack, and the secure volume resides fully within the multi-layer stack.

An anti-tamper, anti-intrusion, tamper-respondent assembly such as summarized above, with a multi-layer stack and an embedded tamper-respondent electronic circuit structure, may be implemented in various configurations, several examples of which are described below with reference to FIGS. 10-13. In general, the tamper-respondent assembly may include one or more of: input/output electrical contacts or bumps to communicate with circuitry outside the multi-layer stack, for instance, for facilitating encrypting/decrypting of secure information within the multi-layer stack; power and ground contacts or bumps to power the function (s) of the tamper-respondent assembly; upper and/or lower sensor components; peripheral tamper-detect circuitry comprising, for instance, one or more layers of through-silicon vias, through-glass vias, through-encapsulant vias, or other similar structure (generally referred to herein as through-substrate vias), to function as an edge-tamper-detect circuit; monitor or compare circuitry to detect any attempt at intrusion into the tamper-respondent assembly; an optional encryption/decryption engine (or other electronic circuit to be protected); and/or other processes as needed for the tamper-respondent assembly to function for an intended purpose. Further, note that the tamper-respondent assembly may include a variety of circuit configurations and functions within the secure volume. For instance, one or more integrated fiber optic circuits may be provided within the tamper-respondent assembly for communicating with other components or entities external to the assembly for faster and more secure communications.

Figure 10:
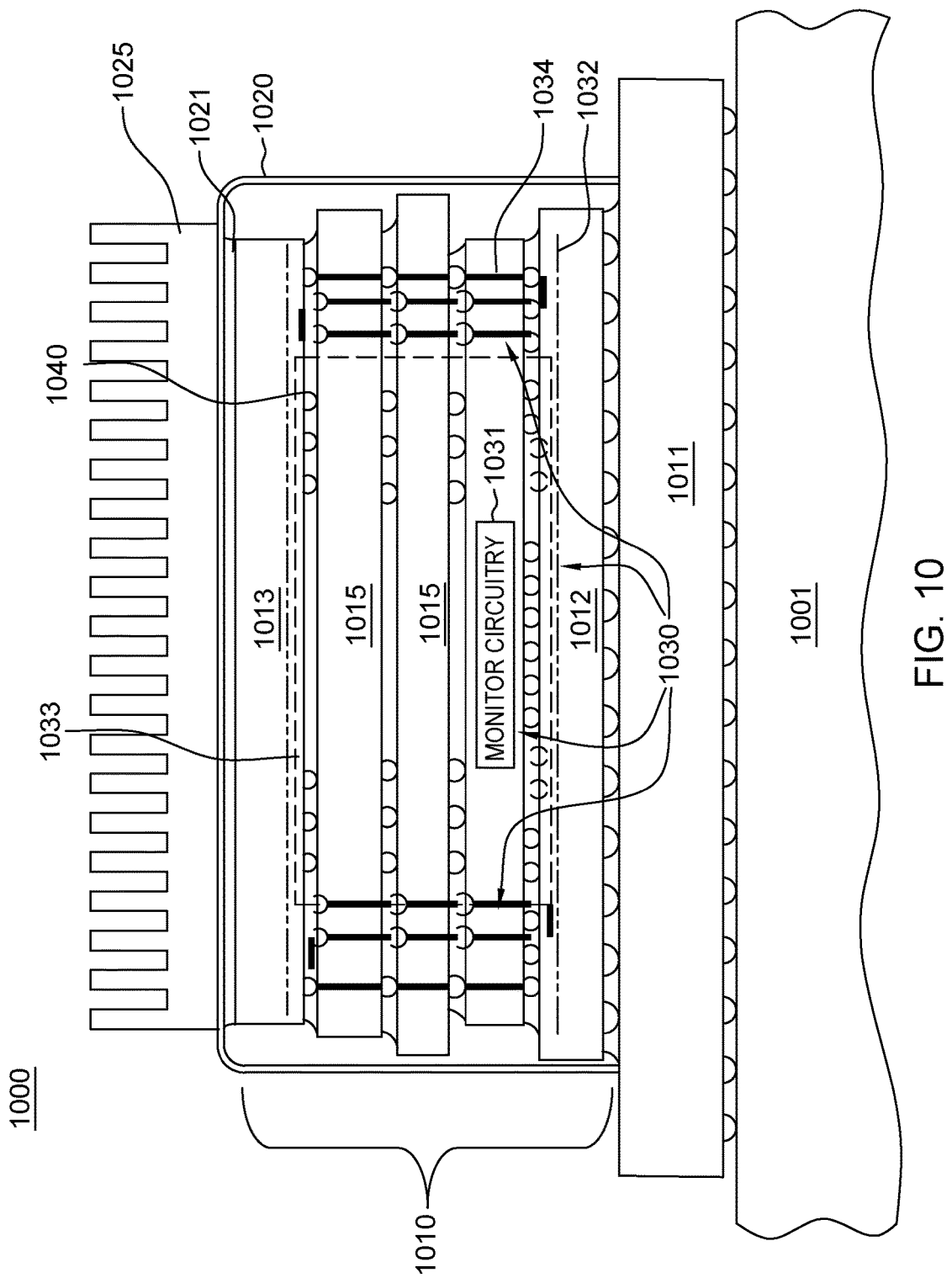
FIG. 10 is an elevational view of one embodiment of a tamper-respondent assembly comprising a multi-layer stack with an embedded tamper-respondent electronic circuit structure, in accordance with one or more aspects of the present invention.

FIG. 10 depicts one embodiment of a tamper-respondent assembly, generally denoted 1000, in accordance with one or more aspects of the present invention. In this embodiment, tamper-respondent assembly 1000 includes a multi-layer stack 1010 which includes, or resides on, by way of example, a base component layer 1011 comprising (for instance) a 2.5D interposer, or alternatively any typical chip substrate (such as a substrate with electrical interconnect fan-out). Base component layer 1011 may couple to (for instance) a multilayer circuit board 1001, such as a printed circuit board or motherboard. Note that in alternate configurations, the multi-layer stack 1010 could couple directly to multilayer circuit board 1001, without an intervening base component layer, such as a substrate interposer. In the depicted example, a thermally conductive cap 1020 resides over multi-layer stack 1010 and is sealed to or in contact with the base component layer 1011, again by way of example only. Additionally, a thermal interface material 1021 may be provided between, for instance, an upper surface of multi-layer stack 1010 and cap 1020. A heat sink 1025, such as an air-cooled heat sink, or a liquid-cooled heat sink, may be coupled to cap 1020, or alternatively, may be coupled to multi-layer stack 1010 directly in the absence of cap 1020.

A tamper-respondent electronic circuit structure 1030 is embedded within multi-layer stack 1010, and includes at least one tamper-respondent sensor (e.g., 1032, 1033, 1034) embedded, at least in part, within at least one component layer 1012, 1013, 1015 of the multiple discrete component layers of multi-layer stack 1010, and includes monitor circuitry 1031 for monitoring the at least one tamper-respondent sensor for a tamper event. Monitor circuitry 1031 is configured and connected to monitor for a tamper event similar to the monitor or compare circuitry described above in connection with the tamper-proof electronic packages of FIGS. 1-9. Advantageously, monitor circuitry 1031 may be disposed within one or more of the component layers 1012, 1013, 1015 in the multi-layer stack 1010, and in particular, within the secure volume 1040 defined by the sensor array within the multi-layer stack 1010.

In one or more implementations, the at least one tamper-respondent sensor includes at least one lower tamper-detect circuit 1032, at least one upper tamper-detect circuit 1033, and at least one peripheral tamper-detect circuit 1034. Advantageously, these tamper-detect circuits are formed within the component layers themselves using, for instance, conventional integrated circuit processes, such as back-end-of-line (BEOL) processes and conventional through-substrate via formation processes. Together, the tamper-detect circuits are configured and electrically connected to the monitor circuitry to define secure volume 1040 in three dimensions, fully embedded within the multi-layer stack 1010, and sized to accommodate any number of electronic devices, components, modules, circuits, etc., to be protected within the stack. As one example, the secure volume may be sized and configured to accommodate an encryption and/or decryption processor, as well as encryption and/or decryption keys.

In one or more implementations, sensor component layers 1012, 1013 may comprise similarly configured tamper-detect circuits. By way of example, FIGS. 11A & 11B depict a partial implementation of sensor component layer 1012. As noted, sensor component layer 1013 may be similarly configured, at least in terms of the tamper-detect circuits employed (in one example), however, possibly inverted in orientation within multi-layer stack 1010 of FIG. 10. Alternatively, those skilled in the art will note that sensor component layer 1013 could be differently configured, provided that the desired at least one upper tamper-detect circuit is provided within that sensor component layer in order to facilitate defining the sensor array comprising the secure volume within the multi-layer stack.

Referring to FIG. 11A, sensor component layer 1012 may comprise a substrate 1100 with, for instance, at least one lower tamper-detect circuit 1032 formed in association with substrate 1100 and extending outward to a periphery 1101 substantially aligned to the edge of the main opposing surfaces of the component layer. Depending on the implementation, substrate 1100 may have or be a substantially crystalline substrate material (e.g., bulk silicon), whereas in other embodiments, substrate 1100 may be formed on the basis of a silicon-on-insulator (SOI) architecture, in which a buried insulating layer may be provided below a circuit or interconnect layer. Other types of substrates 1100 may be used, including, for instance, n-type or p-type doped substrates, silicon-germanium substrates, or may include or be a non-semiconductor material.

As illustrated in FIG. 11B, the at least one lower tamper-detect circuit 1032 may include multiple mat-type, tamper-detect circuits 1110 (or circuit layers) and one or more frame-type, tamper-detect circuits 1111 (or circuit layers). By way of example, the tamper-detect circuits of the at least one lower tamper-detect circuit 1032 may be formed as front-end-of-line (FEOL) layers/structures and/or back-end-of-line (BEOL) layers/structures, depending on the desired implementation. For instance, existing processes for forming integrated circuits may be employed to form tamper-respondent sensors of the patterns described herein and depicted, by way of example, in FIGS. 3 and/or 5A-8G. These tamper-respondent detect circuits may be embedded or formed, for instance, above an active layer of substrate 1100 and/or at a back surface of substrate 1100, and may be electrically connected, via one or more electrical contacts in between component layers of the multi-layer stack to the monitor circuitry 1031 (FIG. 10) disposed, for instance, within the secure volume of the tamper-respondent assembly. By way of example, BEOL layers/structures may conventionally include a plurality of interleaved BEOL dielectric layers and BEOL metallization layers. Thus, forming the at least one lower tamper-detect circuit 1032 on or within substrate 1100 may comprise employing conventional BEOL processes to form the desired tamper-detect circuit patterns stacked one over the other, for instance, in different metal levels using conventional back-end-of-line (BEOL) processing techniques.

By way of further explanation, the tamper-detect circuits may comprise conductive lines, for instance, formed of a metal such as copper or a copper alloy, spaced apart by a dielectric material, and configured as a continuous protective or sense layer across or parallel to either or both of the opposite main surfaces of substrate 1100. In one or more other implementations, separate zones may be formed within the individual tamper-detect circuits of the at least one lower tamper-detect circuit 1032 in a manner analogous to that described above in connection with FIGS. 8A-8G. As noted, the multi-layer stack 1010 of FIG. 10 will include input/output lines extending, in one or more embodiments, through sensor component layer 1012, to electrical contacts, such as conductive bumps, between and electrically connecting sensor component layer 1012 to, for instance, 2.5D interposer 1011 (FIG. 10), and thus to external circuitry.

Additionally, power and ground planes (not shown) for the multi-layer stack could be provided through sensor component layer 1012. These lines would extend through or around or in between the mat-type, tamper-detect circuit layers 1110 (FIG. 11B) of the at least one lower tamper-detect circuit 1032 depicted in FIGS. 11A & 11B. Note that inclusion of one or more frame-type tamper-detect circuits 1111 within or as part of the at least one lower tamper-detect circuit 1032 facilitates extending the secure volume of the multi-layer stack into sensor component layer 1012. Advantageously, by extending the secure volume into sensor component layer 1012, and by analogy, into sensor component layer 1013, then in the embodiment of FIG. 10, additional circuitry may be protected in the secure volume, including for instance, the below-discussed peripheral interconnect lines or stitching for the at least one peripheral tamper-detect circuit 1034 (FIG. 10), which may be disposed on the sensor component layers 1012, 1013.

Figure 12A:
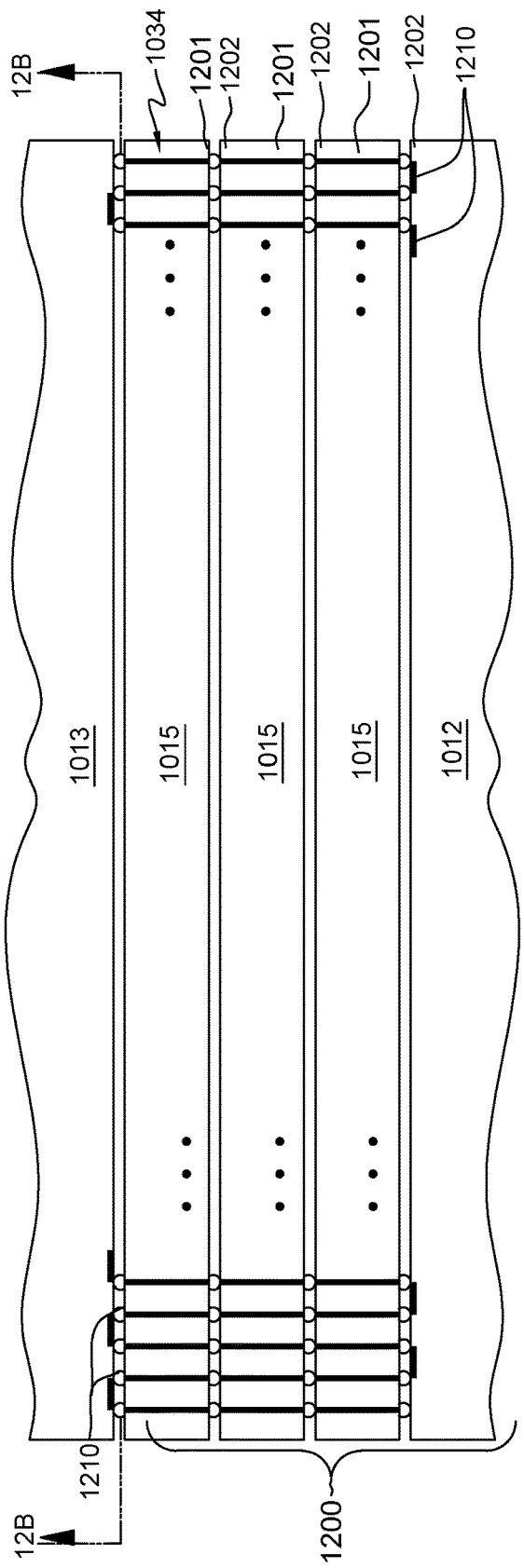
FIG. 12A depicts a sub-stack of multiple in-between component layers of a multi-layer stack such as depicted in FIG. 10, and illustrates one embodiment of at least one peripheral tamper-detect circuit facilitating defining a secure volume within the sub-stack, in accordance with one or more aspects of the present invention.
Figure 13:
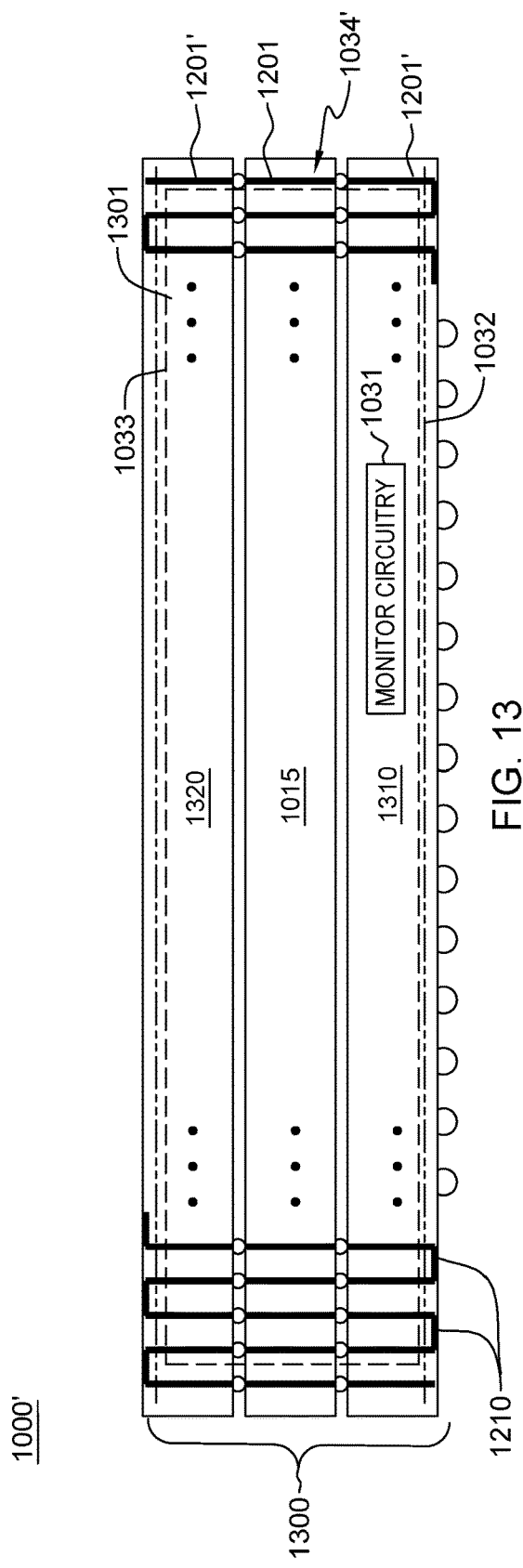
FIG. 13 depicts an alternate embodiment of a tamper-respondent assembly comprising a multi-layer stack and an embedded tamper-respondent electronic circuit structure, in accordance with one or more aspects of the present invention.

FIGS. 12A & 12B depict in greater detail a sub-stack 1200 of multi-layer stack 1010 of FIG. 10. In FIG. 12A, sub-stack 1200 is shown to include multiple in-between component layers 1015, each of which may include active circuitry, such as encrypt/decrypt circuitry, memory circuitry, cache circuitry, etc., as well as monitor circuitry 1031 of the tamper-respondent electronic circuit structure embedded within the multi-layer stack. Note that the three in-between component layer example of FIGS. 10 & 12A is presented by way of example only. For instance, discussed below with reference to FIG. 13 is an alternate example, wherein there is a single in-between component layer.

Continuing with FIG. 12A, sub-stack 1200 is shown to include the at least one peripheral tamper-detect circuit 1034 of the at least one tamper-respondent sensor embedded, in part, within one or more component layers 1015 of the multiple discrete component layers of the multi-layer stack. In particular, in this example, the at least one peripheral tamper-detect circuit 1034 includes respective pluralities of through-substrate vias 1201 extending through and disposed around the peripheries of respective component layers 1015 of sub-stack 1200. As depicted, respective electrical contacts 1202 are disposed in between aligned through-substrate vias 1201 in adjacent component layers 1015 of sub-stack 1200, and together with interconnect lines or stitching 1210 on upper and lower sensor component layers 1012, 1013, one or more peripheral tamper-detect circuits 1034 are formed extending, for example, in a vertically-oriented, continuous sinusoidal manner about the periphery of sub-stack 1200.

In one or more examples, the in-between component layers 1015 may comprise respective substrates that include a semiconductor material, such as a crystalline material. For instance, the substrates may include silicon. Other types of semiconductor materials, such as silicon-germanium (SiGe), germanium (Ge), gallium-arsenic (GaAs), or any other suitable semiconductor materials, including subsequently developed materials, may also be used as or in association with the substrate. The initial thickness of the substrates may be, for instance, about 500-800 μm, and the substrates may be processed to have a final thickness of, for example, about 50-100 μm. Note that the substrate thicknesses may vary depending upon component layer and application, or the integrated circuits formed within, for instance, the active region of the respective component layer. Further, note that the initial and final thicknesses may vary depending on the methodology used and the depth of the through-substrate vias 1201 which are formed. By way of example, each through-substrate via (or through-substrate via conductor) may include, for instance, a conductive material such as copper or a copper alloy. Other types of conductive materials, such as aluminum, tungsten, gold, silver, tin, other metals, or alloys thereof, may also be used to form the through-substrate vias 1201. The diameter of the through-substrate vias may range from, for instance, 10-25 μm, and the depth of the through-substrate vias may range, for instance, from about 20-100 μm. Other diameters and depths of through-substrate vias may also be useful. In one specific embodiment, the size of the through-substrate via is about 25 μm (diameter) by 50-60 μm (depth).

Further, note that the plurality of electrical contacts 1202 electrically connecting aligned through-substrate vias 1201 of adjacent in-between component layers 1015 may comprise micro-sized electrical contacts, such as, micro-C4 bumps, such as micro-C4 solder bumps. By way of specific example, the micro-C4 bumps may be about 25-30 µm in diameter, by about 30 µm high. Note in this regard, that the plurality of through-substrate vias 1201 in each respective component layer 1015 are disposed to form closely spaced, vertical tamper-detect lines of the at least one peripheral tamper-detect circuit 1034. In one or more implementations, the through-substrate vias 1201 may be spaced, for instance, 20-30 µm apart, such as about 25 µm apart. Those skilled in the art will understand that the spacing distance depends, in part, on the integrated circuit process technology employed to form the tamper-respondent sensor(s) of the tamper-respondent electronic circuit structure in the three-dimensional configuration of FIGS. 10-13.

As illustrated in FIG. 12B, and the cross-sectional view of FIG. 10, multiple continuous rows of through-substrate vias 1201 may be formed within the in-between component layers 1015 of the multi-layer stack, with three rows from the edge of each component layer inward being depicted, by way of example only. A single row, or two rows, or any number of rows, could be formed, depending on the tamper-detect application. Note also, that in this example, the aligned through-substrate vias 1201 are electrically connected in-series vertically by aligned interconnecting electrical contacts 1202 in between the component layers.

As noted, FIG. 12B is by way of example a cross-sectional plan view of one embodiment of the sub-stack 1200 of FIG. 12A at upper sensor component layer 1013 of multi-layer stack 1010. As illustrated, in one or more embodiments, the plurality of electrical contacts 1202 disposed over respective aligned columns of through-substrate vias 1201 (FIG. 12A) extending through in-between component layers 1015 are electrically connected via respective electrical interconnect lines or stitching 1210. These interconnect lines 1210 (or stitch connections) are shown to alternate, with a similar but offset pattern of interconnect lines being provided on lower sensor component 1012 (FIG. 12A) such that the vertically-oriented, sinusoidal configuration of FIG. 12A is obtained for the at least one peripheral tamper-detect circuit 1034 (FIG. 12A). Note that various conductive materials and line widths may be employed to interconnect the adjacent electrical contacts 1202 in the patterns depicted in FIG. 12B. By way of example, copper conductors could be employed at or near a surface of upper sensor component layer 1013 using back-end-of-line (BEOL) processing. The conductive lines could be, in one or more implementations, 5-15 µm wide, such as 10 µm wide. Note that the pattern depicted in FIG. 12B is continuous and facilitates defining, in combination with the respective pluralities of through-substrate vias 1201 (FIG. 12A) and in-between electrical contacts 1202, the vertically-extending, peripheral tamper-detect circuit(s) of the tamper-respondent sensor. Note also that the particular wiring configuration being monitored by monitor circuitry 1031 within the secure volume may vary from implementation to implementation. In one implementation, the rows of peripheral tamper-detect circuitry may be connected in a single tamper-detect circuit, while in other configurations, separate tamper-detect circuits may be connected to the monitor circuitry within the secure volume, as desired. Further, note that the rows of through-substrate vias could be connected in any desired configuration of tamper-detect circuits, with the vertically-oriented, sinusoidal configuration depicted being provided as one example only. For instance, increased security may be provided by electrically interconnecting the through-substrate vias in a more random configuration.

By way of further example, FIG. 13 depicts an alternate embodiment of a tamper-respondent assembly 1000' in connection with one or more aspects of the present invention. In this embodiment, a multi-layer stack 1300 is provided, which includes a lower component layer 1310, an upper component layer 1320, and one or more in-between component layer(s) 1015. The in-between component layer 1015 may be configured and characterized, in one or more implementations, as described above in connection with FIGS. 10-12B. In this implementation, the secure volume 1301 defined within multi-layer stack 1300 extends, by way of example, into upper and lower sensor component layers 1310, 1320, such that (for instance) active layers of upper and lower sensor component layers 1310, 1320 may be included within the secure volume, thereby increasing the amount of integrated circuitry or electronic components provided within the stack, notwithstanding a reduced number of component layers in the stack. This can be accomplished, in one embodiment, by moving the lower and upper tamper-detect circuits 1032, 1033 to, for instance, the outermost surfaces of the lower and upper component layers 1310, 1320, respectively. As in the example described above, back-end-of-line (BEOL) processing could be employed to define one or more mat-type, tamper-detect circuits to protect the opposite main surfaces of the multi-layer stack 1300. Further, in this configuration, through-substrate vias 1201' may be provided within the lower and upper sensor component layers 1310, 1320 aligned with respective through-substrate vias 1201 about the periphery or circumference of in-between component layer 1015 to form the one or more peripheral tamper-detect circuits 1034' of the tamper-respondent sensor. Monitor circuitry 1031 of the tamper-respondent electronic circuit structure may be disposed, for instance, in the active layer of any one or more of the component layers in the multi-layer stack, with monitor circuitry 1031 being illustrated in lower sensor component layer 1013, by way of example only. Dimensions and operation of the tamper-respondent sensor, and more generally, the tamper-respondent electronic circuit structure, would be similar to those described above. Note in this regard, that the interconnect lines (or stitch connections) 1210 may be formed near the opposite main surfaces of the multi-layer stack 1300 below, in one or more implementations, one or more mat-type, tamper-detect circuits (or circuit layers) of the respective upper and lower tamper-detect circuits 1033, 1032.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features.

Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A tamper-respondent assembly comprising:
   a multi-layer stack comprising multiple discrete component layers stacked and electrically connected together via a plurality of electrical contacts in between the component layers;
   a tamper-respondent electronic circuit structure embedded within the multi-layer stack, the tamper-respondent electronic circuit structure comprising at least one tamper-respondent sensor embedded, at least in part, within at least one component layer of the multiple discrete component layers of the multi-layer stack, the tamper-respondent electronic circuit structure defining a secure volume within the multi-layer stack; and
   wherein the tamper-respondent electronic circuit structure is embedded within the multi-layer stack, and the secure volume resides fully within the multi-layer stack.

2. The tamper-respondent assembly of claim 1, wherein the multi-layer stack comprises a first component layer, at least one in-between component layer, and a second component layer stacked together, the at least one in-between component layer being disposed between the first component layer and the second component layer in the multi-layer stack, and wherein the tamper-respondent electronic circuit structure is associated with the first component layer, the at least one in-between component layer, and the second component layer, with the secure volume being defined, at least in part, within the at least one in-between component layer.

3. The tamper-respondent assembly of claim 2, wherein the at least one tamper-respondent sensor comprises at least one lower tamper-detect circuit within the first component layer and at least one upper tamper-detect circuit within the second component layer.

4. A method of fabricating a tamper-respondent assembly comprising:
   providing a multi-layer stack comprising multiple discrete component layers stacked and electrically connected together via a plurality of electrical contacts in between the component layers;
   embedding a tamper-respondent electronic circuit structure within the multi-layer stack, the tamper-respondent electronic circuit structure comprising at least one tamper-respondent sensor embedded, at least in part, within at least one component layer of the multiple discrete component layers of the multi-layer stack, the tamper-respondent electronic circuit structure defining a secure volume within the multi-layer stack; and
   wherein the tamper-respondent electronic circuit structure is embedded within the multi-layer stack, and the secure volume resides fully within the multi-layer stack.

5. The method of claim 4, wherein the multi-layer stack comprises a first component layer, at least one in-between component layer, and a second component layer stacked together, the at least one in-between component layer being disposed between the first component layer and the second component layer in the multi-layer stack, and wherein embedding the tamper-respondent electronic circuit structure within the multi-layer stack comprises associating the tamper-respondent electronic circuit structure with the first component layer, the at least one in-between component layer, and the second component layer, with the secure volume being defined, at least in part, within the at least one in-between component layer.

6. The method of claim 5, wherein the at least one tamper-respondent sensor comprises at least one lower tamper-detect circuit within the first component layer and at least one upper tamper-detect circuit within the second component layer.

7. The method of claim 6, wherein the at least one tamper-respondent sensor further comprises at least one peripheral tamper-detect circuit, the at least one peripheral tamper-detect circuit defined, at least in part, by a plurality of through-substrate vias extending through the at least one in-between component layer, wherein the at least one upper tamper-detect circuit, the at least one lower tamper-detect circuit, and the at least one peripheral tamper-detect circuit electrically connect to monitor circuitry of the tamper-respondent electronic circuit structure and facilitate defining the secure volume within the multi-layer stack.

8. The method of claim 7, wherein the at least one peripheral tamper-detect circuit extends between the at least one upper tamper-detect circuit and the at least one lower tamper-detect circuit, and is disposed about the periphery of the at least one in-between component layer.

9. The method of claim 7, wherein the multi-layer structure resides on a base component layer, the base component layer being a 2.5D interposer.

10. The method of claim 5, wherein the multi-layer stack comprises multiple in-between component layers disposed between the first component layer and the second component layer, the at least one in-between component layer being at least one in-between component layer of the multiple in-between component layers, and the at least one tamper-respondent sensor comprises at least one peripheral tamper-detect circuit, the at least one peripheral tamper-detect circuit including respective pluralities of through-substrate vias, each plurality extending through a respective component layer of the multiple in-between component layers, at least some through-substrate vias of the respective pluralities of through-substrate vias being electrically interconnected in the at least one peripheral tamper-detect circuit by respective electrical contacts of the plurality of electrical contacts disposed in between component layers of the multi-layer stack.

11. The method of claim 4, further comprising an under-fill material disposed between adjacent component layers of the multiple discrete component layers, the under-fill material surrounding, at least in part, electrical contacts of the plurality of electrical contacts in between the component layers.

* * * * *